(12) United States Patent
Tudorica et al.

(10) Patent No.: US 9,000,470 B2
(45) Date of Patent: Apr. 7, 2015

(54) LIGHT EMITTER DEVICES

(71) Applicant: Cree, Inc., Durham, NC (US)

(72) Inventors: Florin A. Tudorica, Chapel Hill, NC (US); Christopher P. Hussell, Cary, NC (US); Amber C. Abare, Durham, NC (US); Peter Scott Andrews, Durham, NC (US); Sung Chul Joo, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/168,561

(22) Filed: Jan. 30, 2014

(65) Prior Publication Data

US 2014/0217433 A1    Aug. 7, 2014

Related U.S. Application Data

(63) Continuation-in-part of application No. 14/148,102, filed on Jan. 6, 2014, which is a continuation of application No. 13/104,558, filed on May 10, 2011, now Pat. No. 8,624,271, and a continuation-in-part of (Continued)

(51) Int. Cl.
*H01L 33/00* (2010.01)
*H01L 25/075* (2006.01)
(Continued)

(52) U.S. Cl.
CPC .............. *H01L 33/505* (2013.01); *H01L 24/48* (2013.01); *H01L 24/83* (2013.01);
(Continued)

(58) Field of Classification Search
CPC ......... H01L 33/50; H01L 33/58; H01L 33/60; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742

USPC .............. 257/12–13, 81, 84, 87–88, 98–99; 438/22, 25–26, 27–28, 48–52, 438/E31.117, E21.592; 313/501–506
See application file for complete search history.

(56) References Cited

U.S. PATENT DOCUMENTS

4,855,194 A    8/1989 Wright
4,946,547 A    8/1990 Palmour
(Continued)

FOREIGN PATENT DOCUMENTS

CN    ZL 2011-30139847.5    8/2012
CN    ZL 2011-30166527.9    8/2012
(Continued)

OTHER PUBLICATIONS

U.S. Appl. No. 29/379,636 for "Light Emitting Device Package," filed Nov. 22, 2010.
(Continued)

*Primary Examiner* — Dung A. Le
(74) *Attorney, Agent, or Firm* — Jenkins, Wilson, Taylor & Hunt, P.A.

(57) ABSTRACT

Light emitter devices for light emitting diodes (LED chips) and related methods are disclosed. In one embodiment a light emitter device includes a substrate and a chip on board (COB) array of LED chips disposed over the substrate. A layer having wavelength conversion material provided therein is disposed over the array of LED chips for forming a light emitting surface from which light is emitted upon activation of the LED chips. In some aspects, the wavelength conversion material includes phosphoric or lumiphoric material that is settled and/or more densely concentrated within one or more predetermined portions of the layer. In some aspects, the devices and methods provided herein can comprise a lumen density of approximately 30 lm/mm² or greater.

36 Claims, 25 Drawing Sheets

Related U.S. Application Data application No. 29/379,636, filed on Nov. 22, 2010, now Pat. No. Des. 650,760, and a continuation-in-part of application No. 13/028,972, filed on Feb. 16, 2011, now Pat. No. 8,564,000.

(60) Provisional application No. 61/416,184, filed on Nov. 22, 2010.

(51) Int. Cl.
  *H01L 33/50* (2010.01)
  *H01L 23/00* (2006.01)
  *H01L 25/16* (2006.01)
  *H01L 33/52* (2010.01)

(52) U.S. Cl.
  CPC .......... *H01L 25/0753* (2013.01); *H01L 25/167* (2013.01); *H01L 33/52* (2013.01); *H01L 2224/45099* (2013.01); *H01L 2224/48091* (2013.01); *H01L 2224/48137* (2013.01); *H01L 2224/48227* (2013.01); *H01L 2224/48228* (2013.01); *H01L 2224/73265* (2013.01); *H01L 2224/83192* (2013.01); *H01L 2224/83447* (2013.01); *H01L 2224/8592* (2013.01); *H01L 2224/92247* (2013.01); *H01L 2924/00* (2013.01); *H01L 2924/00014* (2013.01); *H01L 2924/01322* (2013.01); *H01L 2924/10156* (2013.01)

(56) References Cited

U.S. PATENT DOCUMENTS

| | | |
|---|---|---|
| 5,200,022 A | 4/1993 | Kong |
| 5,210,051 A | 5/1993 | Carter, Jr. et al. |
| RE34,861 E | 2/1995 | Davis et al. |
| 5,393,993 A | 2/1995 | Edmond et al. |
| 5,523,589 A | 6/1996 | Edmond et al. |
| 6,093,053 A | 7/2000 | Horioka et al. |
| 6,224,430 B1 | 5/2001 | Kusuda et al. |
| 6,548,832 B1 | 4/2003 | Sakamoto et al. |
| 6,909,051 B2 | 6/2005 | Noble |
| 7,034,778 B1 | 4/2006 | Hähl |
| 7,055,987 B2 | 6/2006 | Staufert |
| D528,672 S | 9/2006 | Nagai |
| D541,761 S | 5/2007 | Saito et al. |
| 7,213,940 B1 | 5/2007 | Van de Ven et al. |
| 7,224,000 B2 | 5/2007 | Aanegola et al. |
| D570,506 S | 6/2008 | Uemoto |
| D570,797 S | 6/2008 | Song |
| D573,553 S | 7/2008 | Uemoto et al. |
| D573,731 S | 7/2008 | Uemoto |
| 7,393,237 B2 | 7/2008 | Kuo |
| D576,576 S | 9/2008 | Shida et al. |
| 7,479,660 B2 | 1/2009 | Kobilke |
| 7,482,636 B2 | 1/2009 | Murayama et al. |
| D586,303 S | 2/2009 | Fuwa et al. |
| D589,470 S | 3/2009 | Chen |
| D591,248 S | 4/2009 | Imai et al. |
| D592,615 S | 5/2009 | Imai et al. |
| D593,043 S | 5/2009 | Song |
| D602,451 S | 10/2009 | Gielen |
| D603,813 S | 11/2009 | Nishimura et al. |
| D607,420 S | 1/2010 | Imai et al. |
| D615,051 S | 5/2010 | Chen et al. |
| D615,052 S | 5/2010 | Imai et al. |
| D618,635 S | 6/2010 | Imai et al. |
| 7,780,313 B2 | 8/2010 | Lam et al. |
| 7,804,147 B2 | 9/2010 | Tarsa et al. |
| 7,812,365 B2 | 10/2010 | Murayama |
| 7,825,578 B2 | 11/2010 | Takashima et al. |
| D630,171 S | 1/2011 | Hsieh |
| 7,872,418 B2 | 1/2011 | Hata et al. |
| D636,899 S | 4/2011 | Shibahara |
| D637,564 S | 5/2011 | Tseng et al. |
| 7,943,952 B2 | 5/2011 | Loh et al. |
| 7,955,147 B1 | 6/2011 | Legrady et al. |
| D640,997 S | 7/2011 | Imai et al. |
| 7,994,518 B2 | 8/2011 | Wang et al. |
| D645,417 S | 9/2011 | Imai et al. |
| 8,044,418 B2 | 10/2011 | Loh et al. |
| 8,058,088 B2 | 11/2011 | Cannon |
| D650,760 S | 12/2011 | Hussell et al. |
| 8,119,534 B2 | 2/2012 | Tanaka et al. |
| D658,601 S | 5/2012 | Egawa et al. |
| D658,602 S | 5/2012 | Egawa et al. |
| D658,603 S | 5/2012 | Egawa et al. |
| 8,167,674 B2 | 5/2012 | Hussell et al. |
| D667,803 S | 9/2012 | Hussell et al. |
| D669,041 S | 10/2012 | Imai et al. |
| D676,000 S | 2/2013 | Hussell et al. |
| D676,395 S | 2/2013 | Hussell et al. |
| 8,410,679 B2 | 4/2013 | Ibbetson et al. |
| 8,425,271 B2 | 4/2013 | Hussell et al. |
| D683,708 S | 6/2013 | Sasano et al. |
| 8,455,908 B2 | 6/2013 | Welch et al. |
| 8,461,613 B2 | 6/2013 | Chou et al. |
| 8,517,572 B2 | 8/2013 | Ferenc |
| D689,451 S | 9/2013 | Shimonishi et al. |
| 8,563,339 B2 | 10/2013 | Tarsa |
| 8,564,000 B2 | 10/2013 | Hussell |
| 8,575,639 B2 | 11/2013 | Hussell |
| 8,624,271 B2 | 1/2014 | Reiherzer |
| D702,653 S | 4/2014 | Wilcox et al. |
| D705,181 S | 5/2014 | Hussell et al. |
| 8,729,589 B2 | 5/2014 | Hussell et al. |
| D706,231 S | 6/2014 | Hussell et al. |
| D707,192 S | 6/2014 | Hussell et al. |
| 8,809,880 B2 | 8/2014 | Hussell |
| D712,850 S | 9/2014 | Welch et al. |
| 2004/0079957 A1 | 4/2004 | Andrews et al. |
| 2004/0196663 A1 | 10/2004 | Ishida et al. |
| 2005/0152145 A1 | 7/2005 | Currie et al. |
| 2005/0199899 A1 | 9/2005 | Lin et al. |
| 2005/0264172 A1 | 12/2005 | Wojnarowski et al. |
| 2006/0139595 A1 | 6/2006 | Koenen et al. |
| 2006/0147746 A1 | 7/2006 | Wakako et al. |
| 2006/0186418 A1 | 8/2006 | Edmond |
| 2007/0018295 A1 | 1/2007 | Kim et al. |
| 2007/0029569 A1 | 2/2007 | Andrews |
| 2007/0096131 A1* | 5/2007 | Chandra .................... 257/99 |
| 2007/0131954 A1 | 6/2007 | Murayama et al. |
| 2007/0158668 A1 | 7/2007 | Tarsa |
| 2007/0194336 A1 | 8/2007 | Shin et al. |
| 2007/0241345 A1 | 10/2007 | Huang |
| 2007/0246730 A1 | 10/2007 | Oishi et al. |
| 2008/0019130 A1 | 1/2008 | Wang |
| 2008/0026498 A1 | 1/2008 | Tarsa et al. |
| 2008/0054279 A1 | 3/2008 | Hussell et al. |
| 2008/0054284 A1 | 3/2008 | Hussell et al. |
| 2008/0054286 A1 | 3/2008 | Loh et al. |
| 2008/0078664 A1 | 4/2008 | Schmidt et al. |
| 2008/0079017 A1 | 4/2008 | Loh et al. |
| 2008/0089072 A1 | 4/2008 | Kim et al. |
| 2008/0106723 A1 | 5/2008 | Hoogendam et al. |
| 2008/0173884 A1 | 7/2008 | Chitnis |
| 2008/0179611 A1 | 7/2008 | Chitnis |
| 2008/0191222 A1 | 8/2008 | Lee |
| 2008/0219003 A1 | 9/2008 | Park |
| 2008/0224166 A1 | 9/2008 | Glovatsky et al. |
| 2008/0239318 A1 | 10/2008 | Den Boef et al. |
| 2008/0258130 A1 | 10/2008 | Bergmann |
| 2009/0009103 A1 | 1/2009 | McKechnie et al. |
| 2009/0023323 A1 | 1/2009 | Lin et al. |
| 2009/0122514 A1 | 5/2009 | Yoon et al. |
| 2009/0130889 A1 | 5/2009 | Daily et al. |
| 2009/0166657 A1 | 7/2009 | Yamada et al. |
| 2009/0239409 A1 | 9/2009 | Bishop |
| 2009/0261374 A1 | 10/2009 | Hayashi |
| 2009/0262527 A1 | 10/2009 | Chou |
| 2009/0289169 A1 | 11/2009 | Yang et al. |
| 2009/0315061 A1 | 12/2009 | Andrews |
| 2010/0078664 A1* | 4/2010 | Helbing .................... 257/98 |

(56) References Cited

U.S. PATENT DOCUMENTS

| | | |
|---|---|---|
| 2010/0096642 A1 | 4/2010 | Chang et al. |
| 2010/0103660 A1 | 4/2010 | Van De Ven et al. |
| 2010/0139836 A1 | 6/2010 | Horikoshi |
| 2010/0141182 A1* | 6/2010 | Shi .................. 315/363 |
| 2010/0155763 A1 | 6/2010 | Donofrio |
| 2010/0193822 A1 | 8/2010 | Inobe et al. |
| 2010/0253248 A1 | 10/2010 | Shi |
| 2010/0270567 A1 | 10/2010 | Emerson et al. |
| 2010/0320483 A1 | 12/2010 | Kadotani et al. |
| 2011/0013400 A1 | 1/2011 | Kanno et al. |
| 2011/0065241 A1 | 3/2011 | Lin et al. |
| 2011/0068674 A1* | 3/2011 | Takenaka et al. ........ 313/318.07 |
| 2011/0068696 A1 | 3/2011 | Van de Ven et al. |
| 2011/0068702 A1 | 3/2011 | Van de Ven et al. |
| 2011/0116275 A1 | 5/2011 | Sheek |
| 2011/0121323 A1 | 5/2011 | Wu et al. |
| 2011/0127912 A1 | 6/2011 | Lee et al. |
| 2011/0128730 A1 | 6/2011 | Chiu |
| 2011/0136394 A1 | 6/2011 | Mostoller et al. |
| 2011/0291151 A1 | 12/2011 | Matsuda et al. |
| 2012/0126255 A1 | 5/2012 | Hussell et al. |
| 2012/0126257 A1 | 5/2012 | Reiherzer et al. |
| 2012/0193651 A1 | 8/2012 | Edmond |
| 2012/0205689 A1 | 8/2012 | Welch |
| 2012/0241807 A1 | 9/2012 | Hoetzl et al. |
| 2012/0250310 A1 | 10/2012 | Hussell et al. |
| 2012/0299022 A1 | 11/2012 | Hussell |
| 2013/0058099 A1 | 3/2013 | Shum et al. |
| 2013/0207130 A1 | 8/2013 | Reiherzer |
| 2013/0207142 A1 | 8/2013 | Reiherzer |
| 2013/0256711 A1 | 10/2013 | Joo et al. |
| 2014/0097453 A1 | 4/2014 | Hussell et al. |
| 2014/0097454 A1 | 4/2014 | Hussell |
| 2014/0183577 A1 | 7/2014 | Hussell et al. |
| 2014/0217433 A1 | 8/2014 | Tudorica et al. |
| 2014/0240974 A1 | 8/2014 | Hussell et al. |

FOREIGN PATENT DOCUMENTS

| | | |
|---|---|---|
| CN | ZL201230099913.5 | 11/2012 |
| CN | ZL20123009998.1 | 12/2012 |
| CN | ZL201230099954.4 | 12/2012 |
| CN | ZL201230099981.1 | 12/2012 |
| CN | ZL 201230472866.4 | 5/2013 |
| CN | ZL201230130915.6 | 10/2013 |
| CN | ZL201230652790.3 | 10/2013 |
| CN | ZL201230652789.0 | 11/2013 |
| CN | ZL201230652840.8 | 11/2013 |
| CN | ZL201330361367.2 | 1/2014 |
| EP | 1640792 | 3/2006 |
| EP | 2327930 | 6/2011 |
| EP | 2 643 861 | 10/2013 |
| EP | 2 643 862 | 10/2013 |
| EP | 2751471 | 7/2014 |
| FR | 2 921 537 | 9/2007 |
| JP | 07-038940 | 9/1995 |
| JP | 10-311937 | 11/1998 |
| JP | 2001-294083 | 10/2001 |
| JP | 2005-266117 | 9/2005 |
| JP | 2006-294898 | 10/2006 |
| JP | 2007-227680 | 9/2007 |
| JP | 2007-266357 | 10/2007 |
| JP | 2007-323857 | 12/2007 |
| JP | 2007-335371 | 12/2007 |
| JP | 2009-044055 | 2/2009 |
| JP | 2009-289918 | 12/2009 |
| JP | 2010-009972 | 1/2010 |
| JP | 1476166 | 7/2013 |
| JP | 1476175 | 7/2013 |
| JP | 1493219 | 2/2014 |
| KR | 3004423910000 | 3/2007 |
| KR | 10-0793338 | 1/2008 |
| KR | 10-2008-0033496 | 4/2008 |
| KR | 10-2008-0092239 | 10/2008 |
| KR | 10-2009-0011121 | 2/2009 |
| KR | 10-2011-0004632 | 1/2011 |
| TW | 540169 | 7/2003 |
| TW | 113260 | 10/2006 |
| TW | 124444 | 8/2008 |
| TW | D125589 | 10/2008 |
| TW | 128526 | 5/2009 |
| TW | 201029146 | 8/2010 |
| TW | D141645 | 7/2011 |
| TW | D144159 | 12/2011 |
| TW | D145644 | 3/2012 |
| TW | D156539 | 10/2013 |
| TW | D159325 | 3/2014 |
| TW | D159326 | 3/2014 |
| TW | D159849 | 4/2014 |
| TW | D159850 | 4/2014 |
| TW | D159851 | 4/2014 |
| TW | D160508 | 5/2014 |
| TW | D160509 | 5/2014 |
| TW | D160580 | 5/2014 |
| TW | D160581 | 5/2014 |
| TW | D160850 | 6/2014 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |
| WO | WO 2013/070696 | 5/2013 |
| WO | WO 2013/096431 | 6/2013 |
| WO | WO 2013/122831 | 8/2013 |

OTHER PUBLICATIONS

Design U.S. Appl. No. 29/380,387 for "Light Emitting Device Package," filed Dec. 3, 2010.
U.S. Appl. No. 13/028,972 for "Light Emitting Devices and Methods," filed Feb. 16, 2011.
U.S. Appl. No. 13/104,558 for "Light Emitting Devices and Methods," filed May 10, 2011.
Notice of Allowance for U.S. Appl. No. 29/379,636 dated Aug. 4, 2011.
Design U.S. Appl. No. 29/404,913 for "Light Emitting Device Component," filed Oct. 26, 2011.
U.S. Appl. No. 13/224,850 for "Light Emitting Device Component," filed Sep. 2, 2011.
Design U.S. Appl. No. 29/379,636 for "Light Emitting Device Package," filed Nov. 22, 2011.
Design U.S. Appl. No. 29/408,955 for "Light Emitting Device Package," filed Dec. 19, 2011.
U.S. Appl. No. 13/336,540 dated Dec. 23, 2011.
Notification of Granting Patent Right of Design for Application Serial No. CN 2011/330166527.9 dated Apr. 6, 2012.
Non-Final Office Action for U.S. Appl. No. 29/380,387 dated Apr. 25, 2012.
Notification of Granting Patent Right for Design for Application Serial No. CN 2011/30139847.5 dated Apr. 26, 2012.
Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
International Search Report and Written Opinion for Application Serial No. PCT/US2011/058596 dated Jun. 18, 2012.
Chinese Office Action for Application Serial No. CN 2012/30130915.6 dated Jul. 12, 2012.
Office Action/Restriction Requirement for U.S. Appl. No. 13/028,972 dated Jul. 25, 2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 17, 2012.

(56) References Cited

OTHER PUBLICATIONS

Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Non-Final Office Action for U.S. Appl. No. 13/028,972 dated Oct. 10, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for U.S. Appl. No. 13/104,558 dated Jan. 3, 2013.
Taiwanese Search Report for Application No. 101302309 dated Jan. 14, 2013.
Taiwanese Office Action for Application No. 101302309 dated Jan. 23, 2013.
Chinese Decision to Grant for Application No. 201230472866.4 dated Jan. 24, 2013.
Notice of Allowance for U.S. Appl. No. 13/336,540 dated Jan. 31, 2013.
Restriction Requirement for U.S. Appl. No. 13/671,089 dated Feb. 7, 2013.
Restriction Requirement for U.S. Appl. No. 29/404,913 dated Feb. 15, 2013.
Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
Notice of Allowance for U.S. Appl. No. 13/028,972 dated Feb. 28, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Non-Final Office Action for U.S. Appl. No. 13/671,089 dated Mar. 29, 2013.
Taiwanese Search Report for Application No. 102300059 dated Apr. 17, 2013.
International Search Report and Written Opinion for Application No. PCT/US2012/070589 dated Apr. 22, 2013.
Taiwanese Search Report for Application No. 102300058 dated Apr. 29, 2013.
International Search Report and Written Opinion for Application No. PCT/US2013/025307 dated May 15, 2013.
Notice of Allowance for U.S. Appl. No. 13/028,972 dated May 23, 2013.
Japanese Office Action for Application No. 2012-031549 dated Jun. 4, 2013.
Japanese Decision of Registration for Application No. 2012-023963 dated Jun. 4, 2013.
Japanese Decision of Registration for Application No. 2012-026117 dated Jun. 4, 2013.
Taiwanese Notice of Allowance for Application No. 101302309 dated Jun. 5, 2013.
Notice of Allowance for U.S. Appl. No. 13/435,912 dated Jun. 19, 2013.
Notice of Allowance for U.S. Appl. No. 29/404,913 dated Jun. 25, 2013.
Chinese Notice of Grant for Application No. 201230652790.3 dated Jun. 26, 2013.
Notice of Allowance for U.S. Appl. No. 13/104,558 dated Jul. 1, 2013.
Chinese Notice of Grant for Application No. 201230130915.6 dated Jul. 3, 2013.
Taiwanese Search Report for Application No. 102301394 dated Jul. 9, 2013.
Taiwanese Search Report for Application No. 102301395 dated Jul. 9, 2013.
Taiwanese Office Action for Application No. 102301394 dated Jul. 15, 2013.
Taiwanese Office Action for Application No. 102301395 dated Jul. 15, 2013.
Chinese Decision to Grant for Application No. 201230652789 dated Jul. 17, 2013.
Chinese Notice of Grant for Application No. 201230652840.3 dated Jul. 26, 2013.
*Ex Parte Quayle Action* for U.S. Appl. No. 13/671,089 dated Aug. 13, 2013.
Korean Office Action for Application No. 30-2012-0020196 dated Aug. 13, 2013.
Korean Office Action for Application No. 30-2012-0020197 dated Aug. 13, 2013.
Korean Office Action for Application No. 30-2012-0020198 dated Aug. 13, 2013.
Taiwanese Office Action for Application No. 102300058 dated Aug. 27, 2013.
Notice of Allowance for U.S. Appl. No. 13/104,558 dated Aug. 28, 2013.
Non-Final Office Action for U.S. Appl. No. 13/224,850 dated Sep. 5, 2013.
Taiwanese Office Action for Application No. 102301581 dated Sep. 6, 2013.
Taiwanese Office Action for Application No. 102301582 dated Sep. 6, 2013.
Taiwanese Office Action for Application No. 102301583 dated Sep. 6, 2013.
Taiwanese Office Action for Application No. 102301584 dated Sep. 6, 2013.
Taiwanese Office Action for Application No. 102301585 dated Sep. 6, 2013.
Restriction Requirement for U.S. Appl. No. 13/793,882 dated Sep. 20, 2013.
Restriction Requirement for U.S. Appl. No. 29/417,220 dated Sep. 27, 2013.
Restriction Requirement for U.S. Appl. No. 29/451,177 dated Sep. 27, 2013.
Restriction Requirement for U.S. Appl. No. 29/425,831 dated Sep. 30, 2013.
Taiwanese Office Action for Application No. 102300059 dated Oct. 1, 2013.
Chinese Notice to Grant for Application No. 201330361367.2 dated Oct. 8, 2013.
Notice of Allowance for U.S. Appl. No. 13/671,089 dated Oct. 22, 2013.
Restriction Requirement for U.S. Appl. No. 29/412,166 dated Oct. 25, 2013.
Restriction Requirement for U.S. Appl. No. 29/412,168 dated Oct. 25, 2013.
Japanese Office Action for Application No. 2012-031548 dated Nov. 5, 2013.
Japanese Office Action for Application No. 2012-031549 dated Nov. 5, 2013.
Taiwanese Notice of Allowance for Application No. 102301394 dated Nov. 8, 2013.
Taiwanese Notice of Allowance for Application No. 102301395 dated Nov. 8, 2013.
Non-Final Office Action for U.S. Appl. No. 13/793,882 dated Nov. 15, 2013.
Restriction Requirement for U.S. Appl. No. 13/282,172 dated Nov. 26, 2013.
Notice of Allowance for U.S. Appl. No. 29/404,913 dated Nov. 27, 2013.
Taiwanese Notice of Allowance for Application No. 102301583 dated Dec. 17, 2013.
Taiwanese Notice of Allowance for Application No. 102301581 dated Dec. 17, 2013.

(56) References Cited

OTHER PUBLICATIONS

Taiwanese Notice of Allowance for Application No. 102301585 dated Dec. 17, 2013.
Notice of Allowance for U.S. Appl. No. 29/412,168 dated Dec. 20, 2013.
Non-Final Office Action for U.S. Appl. No. 29/425,831 dated Dec. 24, 2013.
Notice of Allowance for U.S. Appl. No. 29/412,166 dated Dec. 24, 2013.
Non-Final Office Action for U.S. Appl. No. 29/451,177 dated Dec. 30, 2013.
Notice of Allowance for U.S. Appl. No. 29/417,220 dated Jan. 10, 2014.
Taiwanese Notice of Allowance for Application No. 102301582 dated Jan. 13, 2014.
Taiwanese Notice of Allowance for Application No. 102301584 dated Jan. 13, 2014.
Japanese Decision of Registration for Application No. 2013-018279 dated Jan. 15, 2014.
Taiwanese Notice of Allowance for Application No. 102300058 dated Jan. 17, 2014.
Taiwanese Notice of Allowance for Application No. 102300059 dated Jan. 17, 2014.
Korean Notice of Rejection for Application No. KR 30-2012-0020198 dated Jan. 14, 2014.
Taiwanese Notice of Allowance for Application No. 101307667 dated Feb. 7, 2014.
Supplemental Notice of Allowance for U.S. Appl. No. 29/404,913 dated Feb. 20, 2014.
Notice of Allowance for U.S. Appl. No. 13/793,882 dated Mar. 12, 2014.
Restriction Requirement for U.S. Appl. No. 14/043,494 dated Mar. 20, 2014.
Restriction Requirement for U.S. Appl. No. 13/908,597 dated Mar. 20, 2014.
Restriction Requirement for U.S. Appl. No. 14/052,201 dated Mar. 20, 2014.
Non-Final Office Action for U.S. Appl. No. 13/282,172 dated Mar. 21, 2014.
Taiwanese Office Action for Application No. 100141888 dated Mar. 11, 2014.
Notice of Allowance for U.S. Appl. No. 29/451,177 dated Apr. 25, 2014.
Restriction Requirement for U.S. Appl. No. 14/148,102 dated Apr. 24, 2014.
Korean Notice of Allowance for Application No. 30-2012-0020196 dated Apr. 21, 2014.
Korean Notice of Allowance for Application No. 30-2012-0020197 dated Apr. 21, 2014.
Final Office Action for U.S. Appl. No. 13/224,850 dated May 30, 2014.
Online definition of the term "non-linear", http://thefreedictionary.com/nonlinear, accessed on May 17, 2014.
Final Office Action for U.S. Appl. No. 29/425,831 dated Jun. 10, 2014.
Taiwanese Office Action for Application No. 100141889 dated Aug. 6, 2014.
European Patent Office Communication pursuant to Rule 114(2) EPC for Application No. 20110843026 dated Sep. 24, 2014.
Taiwanese Office Action for Application No. 100141887 dated Sep. 11, 2014.
Korean Office Action for Application No. 10-2013-7015669 dated Jun. 3, 2014.
European Notice of Publication for Application No. 12827778.7 dated Jun. 12, 2014.
Restriction Requirement for U.S. Appl. No. 13/836,709 dated Jun. 19, 2014.
Non-Final Office Action for U.S. Appl. No. 14/052,201 dated Jun. 19, 2014.
Non-Final Office Action for U.S. Appl. No. 14/043,494 dated Jun. 20, 2014.
Non-Final Office Action for U.S. Appl. No. 14/148,102 dated Jun. 20, 2014.
Non-Final Office Action for U.S. Appl. No. 14/189,500 dated Jul. 15, 2014.
Korean Trial Decision for Application No. 30-2012-0020198 dated Jul. 29, 2014.
Notice of Allowance for U.S. Appl. No. 13/908,597 dated Aug. 20, 2014.
European Patent Office Communication pursuant to Rule 114(2) EPC for Application No. 2011-0843773 dated Aug. 20, 2014.
Japanese Office Action for Application No. 2012031548 dated Sep. 1, 2014.
Japanese Office Action for Application No. 2012031549 dated Sep. 1, 2014.
Notice of Allowance for U.S. Appl. No. 29/425,831 dated Sep. 4, 2014.
Final Office Action for U.S. Appl. No. 13/282,172 dated Sep. 17, 2014.

* cited by examiner

LIGHT EMITTER DEVICES

CROSS-REFERENCE TO RELATED APPLICATIONS

This application is a continuation-in-part of U.S. patent application Ser. No. 14/148,102 filed on Jan. 6, 2014 which claims priority to U.S. patent application Ser. No. 13/104,558 filed May 10, 2011, which relates to and claims priority to U.S. Provisional Patent Application Ser. No. 61/416,184, filed Nov. 22, 2010, and is a continuation-in-part of and claims priority to each of U.S. Design patent application Ser. No. 29/379,636, filed Nov. 22, 2010 and U.S. patent application Ser. No. 13/028,972, filed Feb. 16, 2011. The disclosures of each of these prior applications are hereby incorporated by reference in their entireties.

TECHNICAL FIELD

The subject matter disclosed herein relates generally to light emitter devices and methods. More particularly, the subject matter disclosed herein relates to light emitter devices and methods comprising a high density array of light emitting diode (LED) chips with a non-uniform protective layer provided over the array of LED chips.

BACKGROUND

Light emitting diode (LED) chips, may be utilized in packages or devices for providing white light (e.g., perceived as being white or near-white), and are developing as replacements for incandescent, fluorescent, and metal halide high-intensity discharge (HID) light products. A representative example of an LED device comprises a device having at least one LED chip, a portion of which can be coated with a lens or layer of material having uniformly dispersed phosphoric material provided therein such as, for example, yttrium aluminum garnet (YAG). The uniform coating can convert light emitted from one or more LED chips into white light. For example, LED chips can emit light having desired wavelengths, and phosphor can in turn emit yellow fluorescence with a peak wavelength of about 550 nm, for example.

Despite the availability of various LED devices and methods in the marketplace, a need remains for parts delivering a high lumen density or luminous flux densities at high power. One problem associated with conventional devices subjected to high luminous flux densities is the generation of excessive, localized heating. Excessive localized heating can lead to the catastrophic failure of LED devices due to defects associated with thermal degradation and can also cause cracking in the encapsulant or lensed coating or even burning.

Accordingly, a need remains for LED devices and related methods for providing high luminous flux densities at high power applications having improved thermal management. LED devices and methods described herein can advantageously improve light output performance, be operable at very high luminous flux densities, and exhibit improved reliability in high power applications, all while promoting ease of manufacture.

SUMMARY

In accordance with this disclosure, novel light emitter devices and methods are provided herein that are well suited for a variety of applications, including industrial and commercial lighting products. Notably, devices and methods herein output high lumen densities at high power. It is, therefore, an object of the present disclosure herein to provide light emitter devices and methods comprising a substrate and an emission area comprising an array of light emitting diode (LED) chips disposed over a planar surface of the substrate. A layer of material is disposed over the array of LED chips and can comprise a non-uniform distribution of one or more wavelength conversion materials provided therein. The device can, for example, comprise a lumen density of at least 30 lm/mm$^2$ or more.

A method of providing a light emitter device comprises providing an array of LED chips over a substrate, wherein chip spacing between two adjacent LED chips in the array of LED chips is approximately 50 µm or more. The method further comprises providing a viscous material over the array of LED chips, wherein at least one wavelength conversion material is dispersed therein. The method further comprises causing the wavelength conversion material to settle within a predefined portion of the viscous material over the array of LED chips.

Devices and related methods disclosed herein provide, for example, LED devices at a reduced cost, with a reduced number of bubbling defects (e.g., air bubbles trapped in the encapsulant), with increased brightness, with an improved/higher lumen density of at least approximately 30 lm/mm$^2$ or more, with an improved color rendering, with a lower color shift, with improved sulfur resistance, with a smaller color point spread, with improved reliability, with improved long term reliability, and/or with improved thermal properties and/or thermal management, and with all or any combination of such exemplary features.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
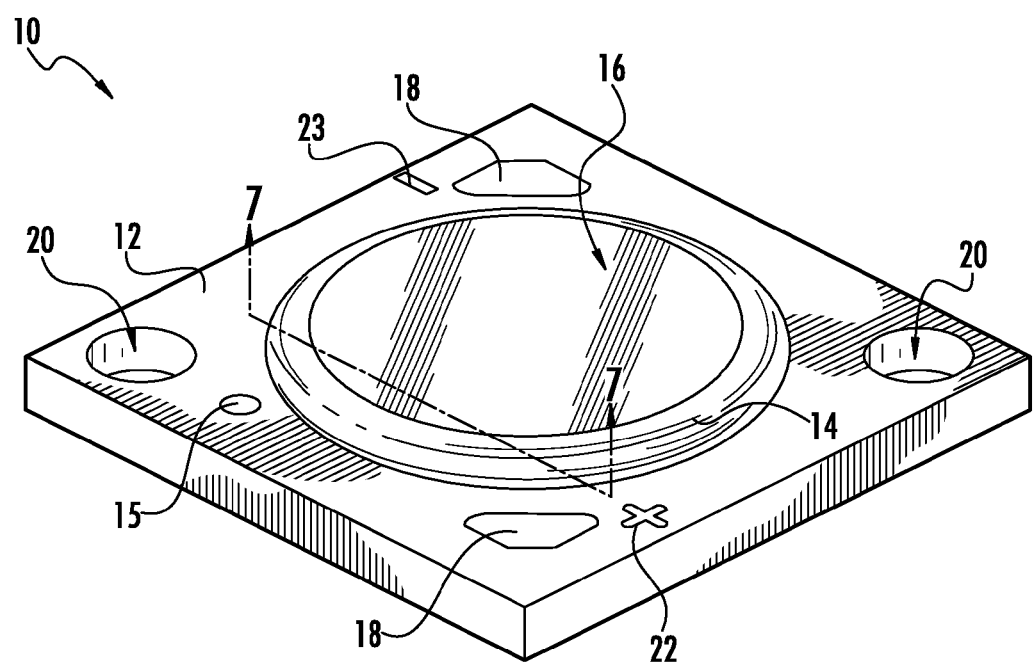
FIG. 1 illustrates a top perspective view of an embodiment of a light emitter device according to the disclosure herein.

Light emitter devices for light emitting diodes (LED chips) and related methods are disclosed herein. In one aspect, a light emitter device includes a substrate and a chip on board (COB) array of LED chips disposed over the substrate. A layer of material, that can be protective, having wavelength conversion material provided therein is disposed over the array of LED chips for forming a light emitting surface from which light is emitted upon activation of the LED chips. In some aspects, the wavelength conversion material includes phosphoric or lumiphoric material that is settled and/or more densely concentrated within one or more predetermined portions of the layer. In some aspects, the devices and methods provided herein comprise or have, for example, a lumen density of at least approximately 30 lm/mm$^2$ or more. In some aspects, devices and methods provided herein comprise a lumen density of at least 60 lm/mm$^2$ or more. In some aspects, devices and methods provided herein comprise a lumen density of at least 90 lm/mm$^2$ or more.

Devices and methods disclosed herein can comprise a closely or tightly packed array of LED chips, where a packing density of the LED chips over a floor of the light emission area can, for example, be between approximately 25% and 50%. The emission area can, for example, comprise a diameter of approximately 6 mm or more, approximately 9 mm or more, or approximately 30 mm or more. Adjacent LED chips can be spaced apart by a distance of at least approximately 50 μm or more. In other aspects, adjacent LED chips can be spaced apart, for example, by a distance of at least approximately 200 μm or more, at least approximately 300 μm or more, at least approximately 400 μm or more, or more than approximately 500 μm.

As described herein, wavelength conversion material can comprise at least one phosphor for converting light emitted by at least one LED chip to a peak wavelength in a red, a green, a yellow, a blue, a white color and/or combinations thereof.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitters according to embodiments described herein may comprise group III-V nitride (e.g., gallium nitride) based light emitting diode (LED) chips or LEDs, or lasers fabricated on a growth substrate, for example, silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861, U.S. Pat. Nos. 4,946,547, and 5,200,022, the disclosures of which are incorporated by reference herein in their entireties.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as Al$_x$Ga1- xN where 1>x>0 are often used to describe these compounds. Techniques for epitaxial growth of Group III nitrides have become reasonably well developed and reported in the appropriate scientific literature.

Although various embodiments of LED chips disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LED chips according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED chip after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

An LED can be coated, at least partially, with one or more wavelength conversion materials comprising phosphoric or lumiphoric materials, such as phosphors. The phosphors can absorb at least a portion of the LED chip light and emitting a different wavelength of light such that the LED chip emits a combination of light from the LED chip and the phosphor. In one embodiment, the LED chip emits a white light combination of LED and phosphor light. An LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. In the alternative, LED chips can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. Other suitable methods of coating LED chips are described in U.S. Pat. Nos. 8,167,674, 8,425,271 and 8,410,679, each of which are also incorporated herein by reference in the entirety. Notably, LED chips described herein can also be coated with a coating or protective layer having a non-uniform distribution of wavelength conversion material (e.g., phosphors or lumiphors) provided therein, It is understood that LED devices and methods according to the present subject matter can also have multiple LED chips of different colors, one or more of which may be white emitting.

Figure 8:
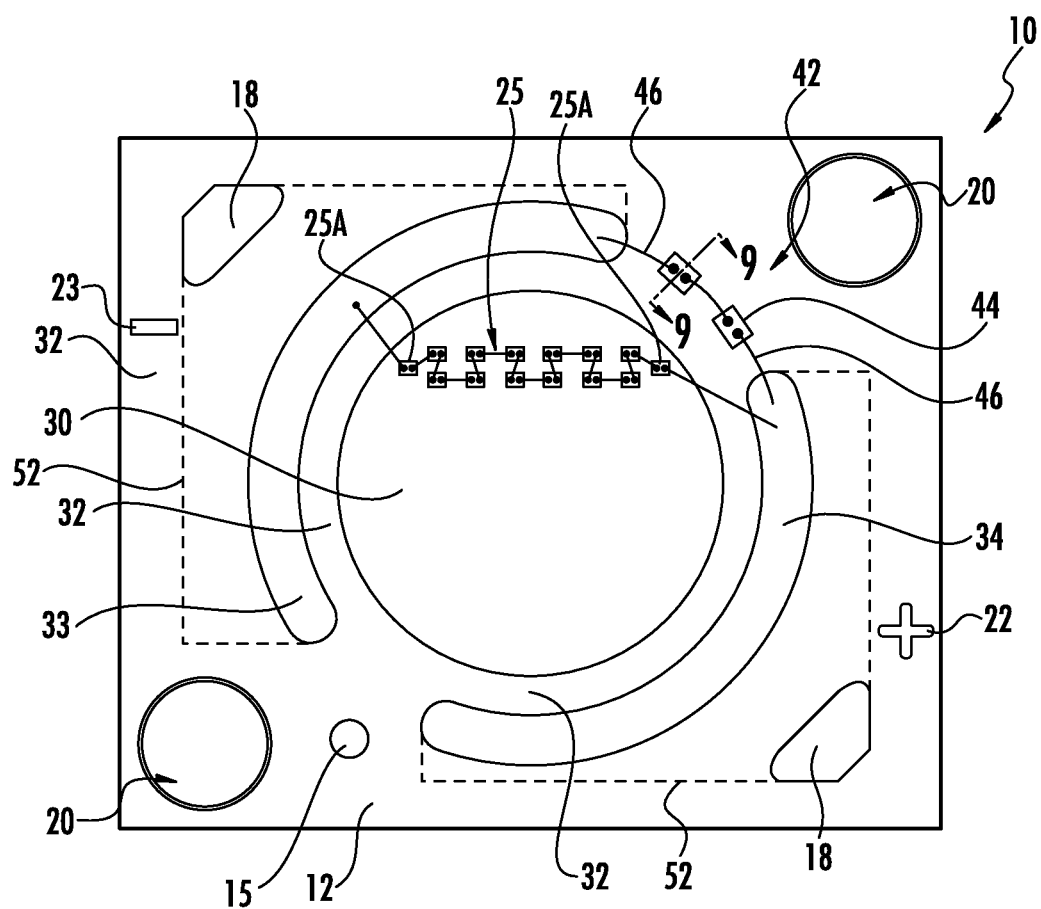
FIG. 8 illustrates a top view of a light emitter device according to the disclosure herein.
Figure 9:
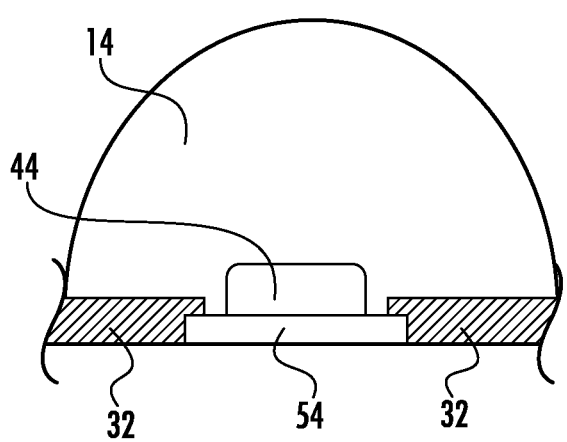
FIG. 9 illustrates a cross-sectional view of a gap area of a light emitter device according to the disclosure herein.

Referring now to FIGS. 1 to 21, FIG. 1 illustrates a top view of a light emitter or LED device, generally designated 10. LED device 10 can comprise a substrate 12 over which an emission area, generally designated 16, can be disposed. In one aspect, emission area 16 can be disposed substantially centrally with respect to LED device 10. In the alternative, emission area 16 can be disposed in any location over LED device 10, for example, in a corner or adjacent an edge. In one aspect, emission area 16 can comprise a substantially circular shape. In other aspects, emission area 16 can comprise any other suitable shape, for example, a substantially square, oval, or rectangle shape. LED device 10 can comprise a single emission area 16 or more than one emission area 16. Notably, LED device 10 can comprise a uniform optical source in the form of emission area which can simplify the manufacturing process for manufacturers of light products requiring a single component. LED device 10 can further comprise a retention material 14 disposed at least partially about emission area 16 where retention material 14 can be referred to as a dam. Retention material 14 can also be disposed over at least one electrostatic discharge (ESD) protection device, such as a Zener diode 44 (FIG. 9). In some aspects, retention material can be disposed over two Zener diodes 44 connected in series between two electrical elements (FIG. 8).

Substrate 12 can comprise any suitable mounting substrate, for example, a printed circuit board (PCB), a metal core printed circuit board (MCPCB), an external circuit, or any other suitable substrate over which light emitter devices such as LED chips or LEDs may mount and/or attach. Emission area 16 can be in electrical and/or thermal communication with substrate 12. One or more intervening layers can be disposed between emission area 16 and substrate 12 such that emission area 16 is indirectly disposed over substrate 12 thereby indirectly electrically and/or thermally communicating with substrate 12. In the alternative, emission area 16 can directly mount over substrate 12 thereby directly electrically and/or thermally communicating, or connecting, with substrate 12. In one aspect and for example only without limitation, substrate 12 can comprise a compact dimension of 22 millimeter (mm)×22-mm square footprint. In other aspects, substrate 12 can comprise any suitable dimension and/or shape, for example, a circular or rectangular shape.

Figure 7:
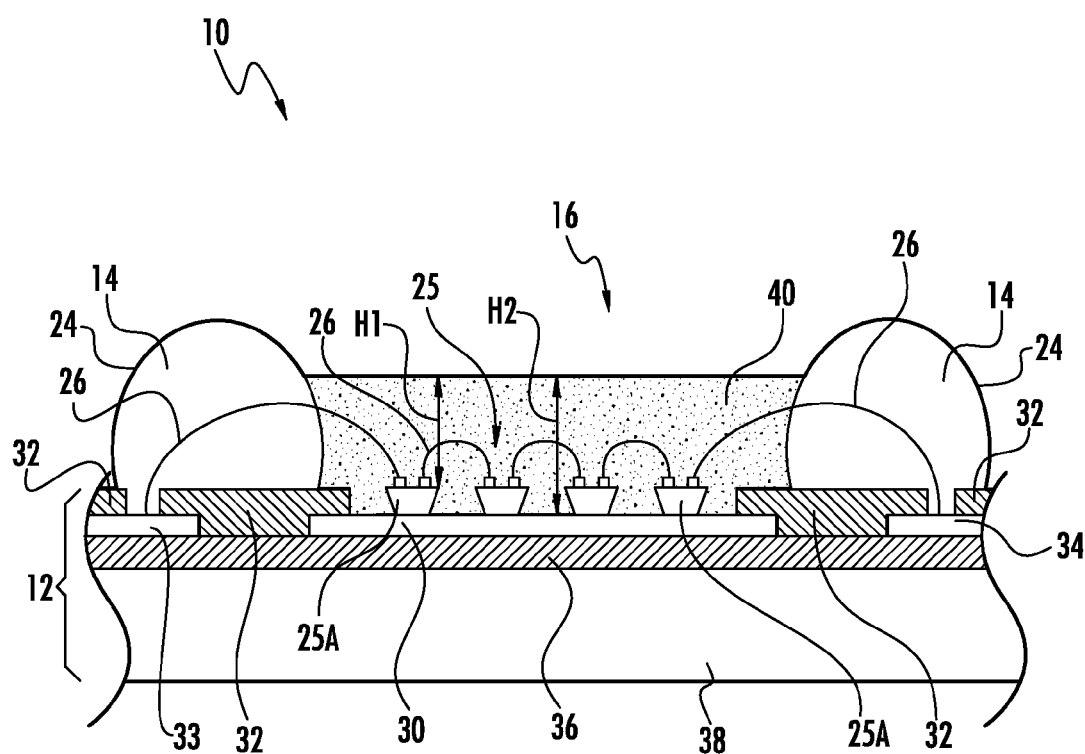
FIG. 7 illustrates a second cross-sectional view of a light emission area of a light emitter device according to the disclosure herein.

Emission area 16 can comprise a plurality of LEDs, or LED chips 25 disposed within and/or below a filling material 40 such as illustrated in FIG. 7. LED chips 25 can comprise any suitable size and/or shape. For example, LED chips 25 can have a rectangle, square, or any other suitable shape. In one aspect, filling material 40 can comprise an encapsulant having a predetermined, or selective, amount of phosphors and/or lumiphors in an amount suitable for any desired light emission, for example, suitable for white light conversion. Filling material 40 can interact with light emitted from the plurality of LED chips 25 such that a perceived white light, or any suitable and/or desirable wavelength of light, can be observed. Any suitable combination of encapsulant and/or phosphors can be used, and combinations of different phosphors for resulting in desired light emission can be used.

In other aspects, filling material 40 can comprise a molded lens material. Filling material 40 can be substantially opaque such that emission area 16 can be substantially opaque (as illustrated in FIG. 1), transparent, or semi-transparent depending upon, for example, the amount and type of phosphor used. Retention material 14 can be adapted for dispensing, or placing, about at least a portion of emission area 16.

After placement of retention material 14, filling material 40 can be selectively filled to any suitable level within the space disposed between one or more inner walls of retention material 14. For example, filling material 40 can be filled to a level equal to the height of retention material 14 or to any level above or below retention material. The level of filling material 40 can be planar or curved in any suitable manner, such as concave or convex.

Still referring to FIG. 1, LED device 10 can also comprise at least one opening or hole, generally designated 20, that can be disposed through or at least partially through substrate 12 for facilitating attachment of LED device 10 to an external substrate or surface. For example, one or more screws can be inserted through the at least one hole 20 for securing device 10 to another member, structure, or substrate. LED device 10 can also comprise one or more electrical attachment surfaces 18. In one aspect, attachment surfaces 18 comprise electrical contacts such as solder contacts. Attachment surfaces 18 can be any suitable configuration, size, shape and/or location and can comprise positive and negative electrode terminals through which an electrical current or signal can pass when connected to an external power source. One or more conducting wires (not shown) can be attached and electrically connected to attachment surfaces 18 when welded, soldered, or any other suitable attachment method known. Electrical current or signal can pass into LED device 10 from the external wires electrically connected to the attachment surfaces 18 and into the emission area 16 to facilitate light output. Attachment surfaces 18 can electrically communicate with emission area 16 which comprises one or more LED chips 25. Attachment surfaces 18 can electrically communicate with first and second conductive traces 33 and 34 (see FIG. 8) and therefore LED chips 25 which may be electrically connected using electrical connectors. Electrical connectors can comprise wirebonds or other suitable members for electrically connecting LED chips 25 to first and second conductive traces 34 and 33.

LED device 10 can further comprise an indicator sign or symbol for denoting the electrical polarity for a given a side of LED device 10. For example, a first symbol 22 can comprise a "+" sign denoting the side of LED device 10 comprising the positive electrode terminal. A second symbol 23 can comprise a "−" sign denoting the side of LED device 10 comprising the negative electrode terminal. One or more test points 15 can be located adjacent either a positive or negative side of the device for testing the electrical and/or thermal properties of the LED device 10. In one aspect, test point 15 can be disposed adjacent the negative side, or terminal of LED device 10.

Figure 2:
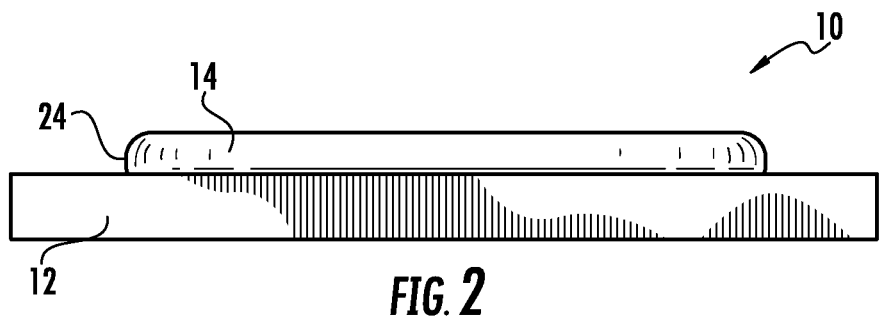
FIG. 2 illustrates a side view of an embodiment of a light emitter device according to the disclosure herein.

FIG. 2 illustrates a side view of LED device 10. As illustrated by FIGS. 1 and 2, retention material 14 can comprise a substantially circular dam disposed about at least a portion of emission area 16 and disposed over substrate 12. Retention material 14 can be dispensed, positioned or otherwise placed over substrate 12 and can comprise any suitable size and/or shape. Retention material 14 can comprise any suitable reflective material and can comprise a clear or opaque white material such as, for example, a silicone or epoxy material. Filler particles such as titanium dioxide ($TiO_2$), for example, can be used and added to retention material 14 for providing an opaque material. Retention material 14 can be dispensed or deposited in place using an automated dispensing machine where any suitable size and/or shape of dam can be formed. In one aspect, a circular shape as shown can be dispensed, although any other configuration could also be provided such as, for example, a rectangular configuration, a curved configuration and/or any combination of desired configurations and cross-sectional shapes. As FIG. 2 illustrates in a side view of LED device 10, retention material 14 can comprise a rounded outer wall 24 such that the upper surface of retention material 14 opposite substrate 12 is rounded. Rounding or curving outer wall 24 of retention material 14 may further improve the amount of light reflected by LED device 10.

Figure 3A:
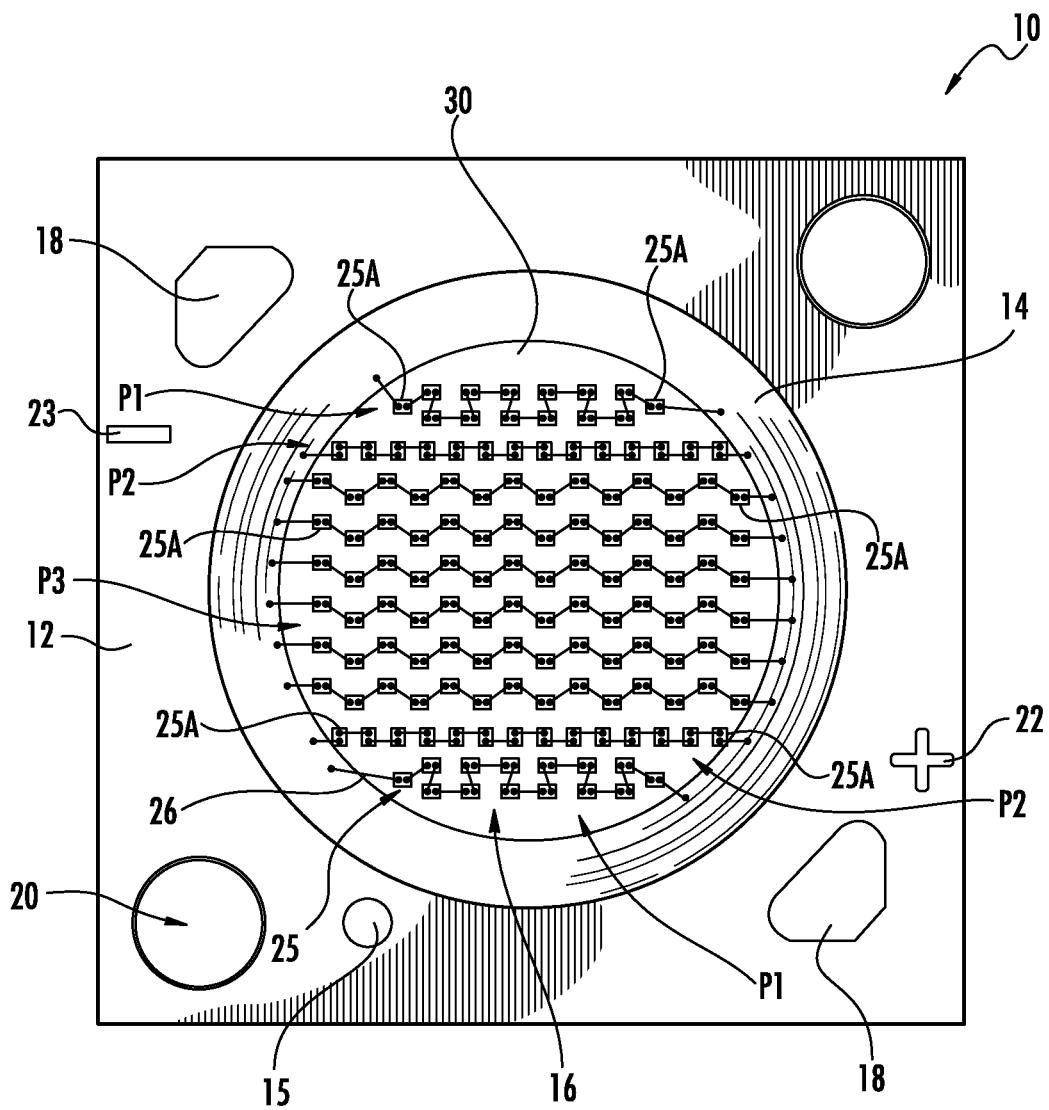
FIGS. 3A and 3B illustrate top views of an embodiment of a light emitter device having one or more patterns of light emitting diodes (LED) chips according to the disclosure herein.
Figure 3B:
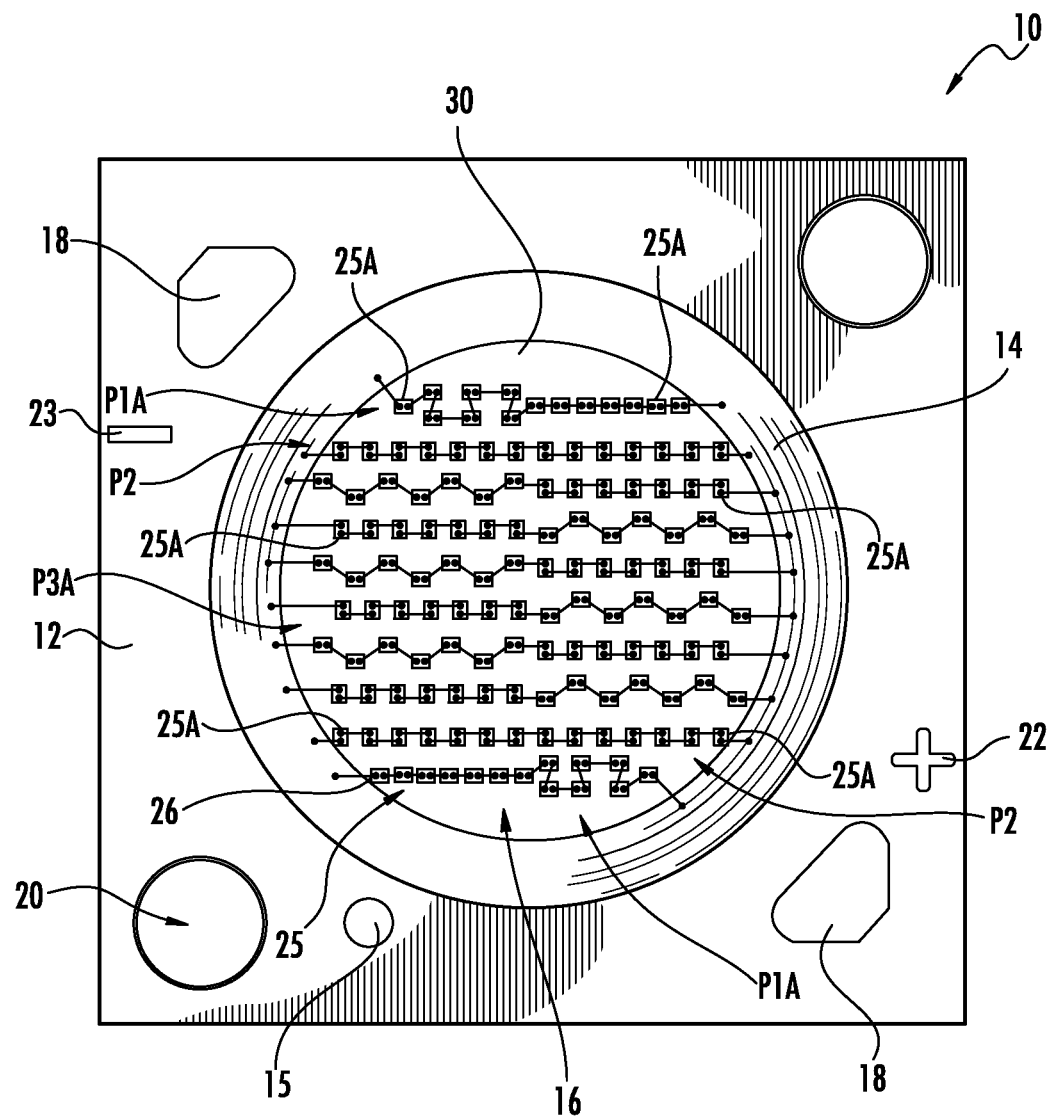

Retention material 14 can comprise any material known in the art, for example, a silicone material comprising 7% fumed silica+3% $TiO_2$+methyl silicone. As illustrated in FIGS. 3A and 3B, retention material 14 can be dispensed after wirebonding of the one or more LED chips, generally designated 25, such that retention material 14 is disposed over and at least partially covers wirebonds 26 to contain at least a portion, such as one end of each of wirebonds 26 within retention material 14. In FIGS. 3A and 3B, wirebonds 26 for the first and last, or outermost edge LED chips 25A for a given set of LED chips such as LED chips 25 are disposed within retention material 14. In one aspect, retention material 14 can be "planed" during dispersion at room temperature for accurate volume and/or height control. The addition of $TiO_2$ can increase reflection about the emission area 16 to further to optimize light emission of LED device 10. Fumed silica can be added as a thixotropic agent. Dispersing retention material 14 can allow increased board space and the ability to withstand higher voltages. In some aspects, LED device 10 can be operable at 42 volts (V) or higher.

Figure 4:
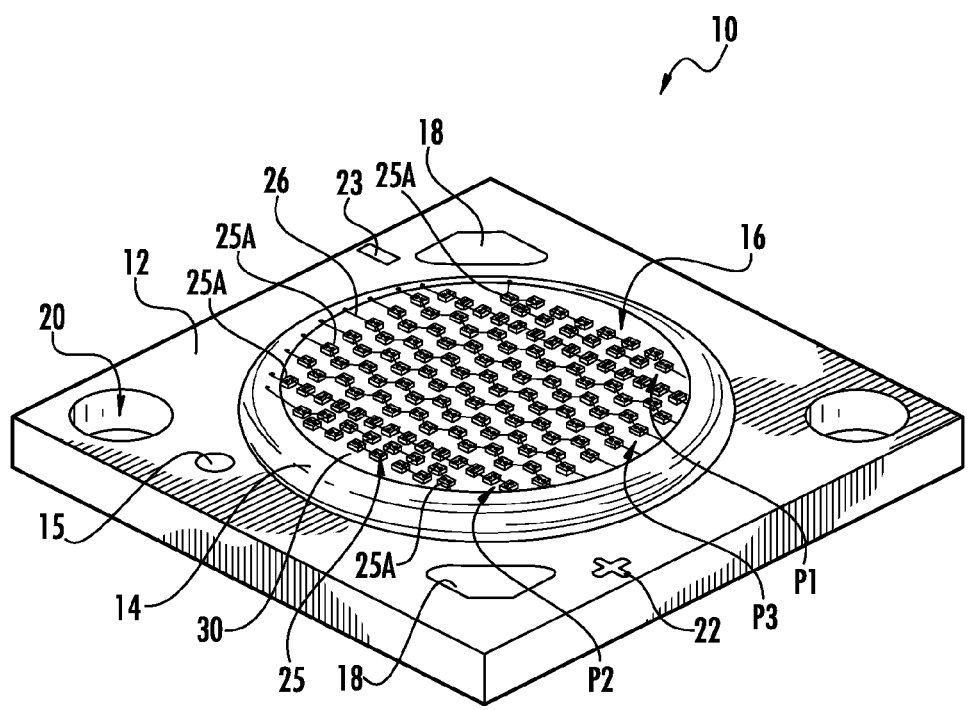
FIG. 4 illustrates a top perspective view of an embodiment of a light emitter device having one or more patterns of LED chips according to the disclosure herein.

FIGS. 3A, 3B and 4 illustrate emission area 16 without a layer of filling material 40. FIGS. 3A and 3B illustrate LED device 10 and emission area 16 comprising at least one pattern, or arrangement, of LED chips therein. LED chips 25 can be arranged, disposed, or mounted over a conducting pad 30. LED chips 25 can be arranged or disposed in sets of LED chips, that can comprise one or more strings or LED chips, and a given set of LED chips can for example be one or more strings of LED chips electrically connected in series or any other suitable configuration. More than one set of LED chips can be provided, and each set of LED chips can be arranged in parallel to one or more other sets of LED chips. As described further herein, the LED chips in any given set or string of LED chips can be arranged in any suitable pattern or configuration, and even LED chips within a given set or string of LED chips can be arranged or disposed in one or more different patterns or configurations. For example, FIG. 3A illustrates at least three sets of LED chips arranged in three patterns, for example, a first pattern P1, a second pattern P2, and a third pattern P3. Each of patterns P1, P2, and P3 can comprise a consistent pattern design across emission area 16. More than one of patterns P1, P2, and/or P3 can be used. Each of patterns P1, P2, and/or P3 can alternate or be arranged in any suitable configuration. For illustration purposes, only three patterns are illustrated.

Any number of patterns or arrangements is contemplated, and patterns can comprise any suitable design, for example, a checkerboard design or a grid design or arrangement wherein LED chips can be at least substantially aligned in at least two directions. FIG. 3B illustrates at least three sets of LED chips arranged in patterns, for example, a first pattern P1A, second pattern P2, and a third pattern P3A which combine one or more of patterns P1, P2, and P3 illustrated in FIG. 3A. For example, patterns P1A and P3A can comprise a combination of more than one pattern. In one aspect, pattern P1A can comprise a grid arrangement or pattern and a straight line arrangement or pattern. In one aspect, pattern P3A can comprise the checkerboard and straight line pattern designs. Each of patterns P1A and P3A can comprise 14 LED chips 25, seven LED chips of each pattern design. For illustration purposes, only two combinations are illustrated. However, please note that each set of LED chips can comprise a combination of having more than two patterns.

Still referring to FIGS. 3A and 3B, conducting pad 30 can be electrically and/or thermally conducting and can comprise any suitable electrically and/or thermally conducting material. In one aspect, conducting pad 30 can comprise a conductive metal. In one aspect shown in FIG. 3A, emission area 16 can comprise one or more LED chips 25 arranged in a single pattern over conducting surface, or pad 30. In an alternative, LED chips can be provided that are a combination of more than one pattern of LED chips, such as LED chips 25, arranged over conducting pad 30 as FIG. 3B illustrates. As noted above, emission area 16 can comprise a combination of different arrangements or patterns, for example, a combination of first pattern P1, second pattern P2 and/or third pattern P3 for optimizing light emission and device brightness. Each set, or string of LED chips 25 disposed over conducting pad 30 can comprise outermost LED chips 25A with one or more LED chips 25 disposed therebetween. Each string of LED chips 25 can comprise the same or a different pattern, for example, patterns P1, P2, and/or P3. Strings of LED chips 25 can comprise diodes of the same and/or different colors, or wavelength bins, and different colors of phosphors can be used in the filling material 40 (FIG. 7) disposed over LED CHIPS 25 that are the same or different colors in order to achieve emitted light of a desired wavelength. The one or more patterns of LED chips 25 can comprise an array of LED chips within emission area 16.

FIGS. 3A, 3B, and 4 illustrate emission area 16 comprising, for example, 10 lines, or strings, of LED chips 25. Each string of LED chips 25 can comprise any suitable number of LED chips electrically connected between outermost LED chips 25A which can connect to respective electrical elements. In one aspect, each string of LED chips 25 can comprise at least 14 LED chips. In one aspect, LED device can comprise at least 140 LED chips arranged in an array. The arrangements, patterns, and/or combination of multiple patterns herein can comprise an array for optimizing color uniformity and brightness of light emitted from LED device 10. LED chips can be electrically connected in series using one or more wirebonds 26 for attaching bond pads of adjacent LED chips 25.

In one aspect as shown in FIG. 3A, first pattern P1 can comprise the first and tenth strings of 14 LED chips 25. First pattern P1 can comprise two opposing lines of LED chips 25 disposed between the first and last, or outermost LED chips 25A of the series. In one aspect, first pattern P1 comprises what is referred to herein as a grid arrangement, pattern or design, where at least two LED chips are at least substantially aligned in at least two directions and can include single, unaligned LED chips at opposing ends of a set or string of LED chips. Each of the LED chips 25 comprising first pattern P1 can be electrically connected in series.

In one aspect, second arrangement or second pattern P2 can be disposed adjacent first pattern P1, for example, located at the second and ninth strings of LED chips 25. In one aspect, second pattern P2 can comprise 14 total LED chips 25 wherein each of the 14 LED chips 25 can be arranged adjacent each other along a horizontal line in a straight line design, or arrangement, and each of the 14 LED chips 25 can be electrically connected in series. Any suitable number of LED chips 25 can be connected in any suitable configuration or arrangement such as in series to form a string having a suitable pattern. Care should be taken when connecting LED chips 25 in series such that the positive or negative electrode of a preceding LED electrically connects to an electrode of opposite electrical polarity for a subsequent LED for allowing electrical current to flow properly through the string of LED chips 25.

Third pattern P3 shown in FIG. 3A can comprise a checkerboard pattern having a checkerboard design, or arrangement of LED chips 25 electrically connected in series. In one aspect, at least 14 LED chips 25 can comprise the checkerboard pattern, and third pattern P3 can be disposed between and/or alternate with strings of LED chips having second pattern P2. The checkerboard pattern or third pattern P3 can comprise a set of LED chips 25 alternating both above and below a horizontal line. Patterns P1, P2, and P3 are not limited in the shape of pattern or to at least 14 LED chips, but rather, patterns can comprise any suitable arrangement and any suitable number of LED chips 25. For illustration purposes, only three patterns are shown although any suitable number of patterns could be utilized. The alternating LED chips 25 of third pattern P3 can optimize light output by ensuring uniform coverage and spatial alignment over conducting pad 30 such that light emission is uniform and improved. Third pattern P3 can repeat from the third through the eighth string of LED chips 25. First and last LED chips 25A in a given string of LED chips 25 for each of patterns P1, P2, and/or P3 can electrically connect to first and second conductive traces 33 and 34 (see FIGS. 7, 8) for receiving and transmitting electrical current or signal through and illuminating a given string of LED chips 25.

The LED chips even in a single set or string in emission area 16 can comprise LED chips in more than one pattern or configuration. For example, FIG. 3B illustrates one aspect of a possible arrangement of LED chips in emission area 16 where there are at least two sets, shown here as strings without limitation, of LED chips 25 and where LED chips 25 for some sets or strings are arranged in different patterns or configurations with respect to another set or string of LED chips and even within one single set or string of LED chips. Any two given separate sets or strings of LED chips 25 can be electrically connected in a pattern such that some or all of the LED chips within each of the two sets or strings of LED chips can be arranged in different patterns, in identical patterns, or in any combination of patterns. In other words, the LED chips in any given set or string can be disposed in different or identical patterns with respect not only to the LED chips in that set or string but can also be disposed in any pattern with respect to another set or string of LED chips and the two sets or strings can in one aspect be parallel to one another. For example, LED chips 25 in FIG. 3B can be disposed in one aspect such that emission area 16 comprises a combination of different arrangements or patterns, for example, a first pattern P1A, a second pattern P2A and/or a third pattern P3A for optimizing light emission and device brightness. As noted earlier, patterns P1A and P3A illustrate a combination of two different patterns, for example at least two of the checkerboard, straight line and/or grid arrangement, however, combinations of more than two patterns are hereby contemplated.

Only three pattern arrangements have been disclosed (i.e., checkerboard, grid, straight line), but any suitable arrangement or pattern design can be used. Each string of LED chips 25 disposed over conducting pad 30 can comprise outermost LED chips 25A with one or more LED chips 25 disposed therebetween. Each set or string of LED chips 25 can comprise the same or a different pattern, for example, patterns P1A, P2A, and/or P3A. Sets or strings of LED chips 25 can comprise diodes of the same and/or different colors, or wavelength bins, and different colors of phosphors can be used in the filling material 40 (FIG. 7) disposed over LED chips 25 that are the same or different colors in order to achieve emitted light of a desired wavelength.

The one or more patterns of LED chips 25 can comprise an array of LED chips within emission area 16. As FIG. 3B illustrates, for example, in pattern P3A, sets of LED CHIPS 25 can comprise rectangular LED chips arranged where the major (i.e., long) axis of a first LED is disposed in a different orientation than the major axis of at least a second LED. That is, a given set of LED chips 25 can comprise LED chips 25 in different orientations. In other aspects, as illustrated in FIG. 3A for example, pattern P2 and pattern P3 can comprise sets of rectangular LED chips 25 where the major axis is the same is the same for the given set but different from the orientation of other sets.

The various LED chip arrangements and device designs as described herein are advantageous for providing a light emitter device with excellent performance and output while still being a small light emitter device where pressure exists to provide small devices while maintaining quality performance and light output.

Figure 5:
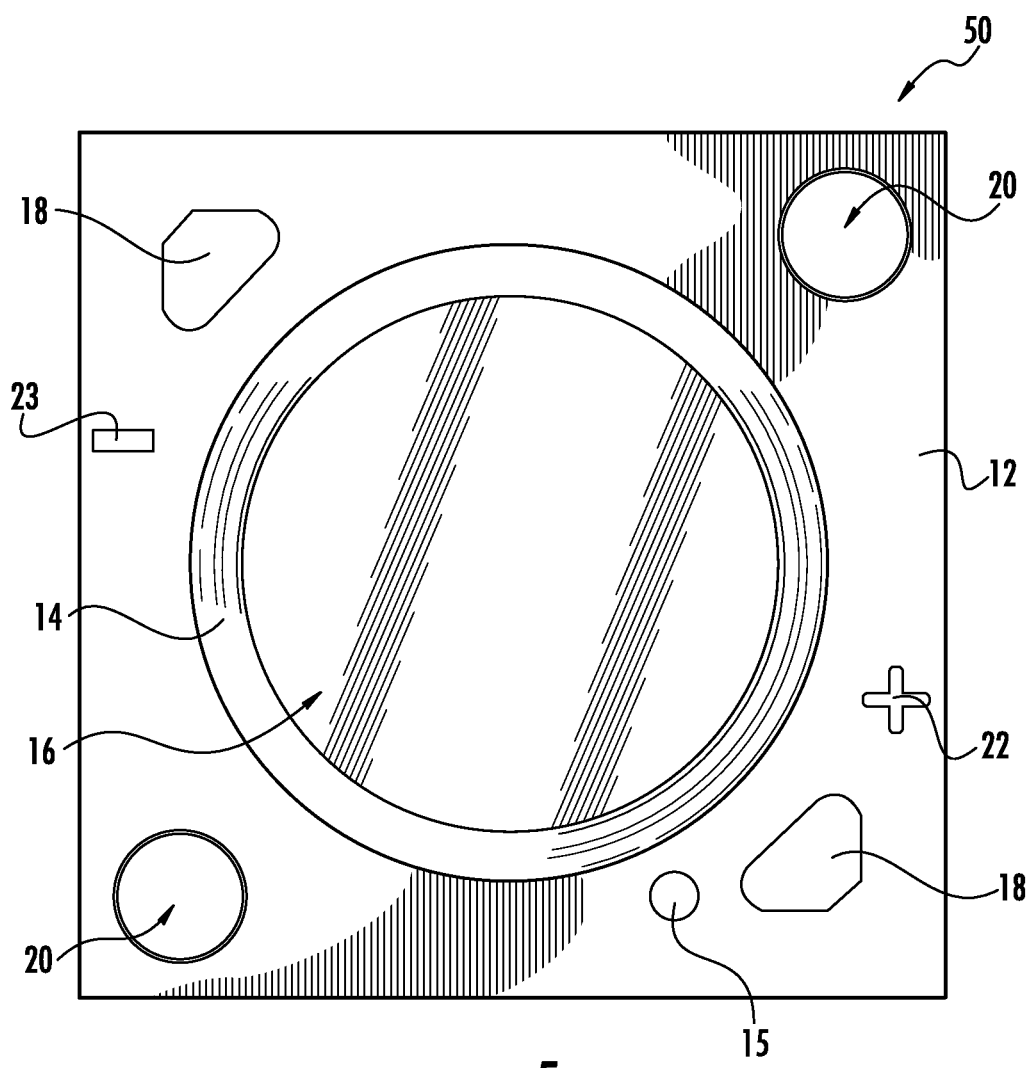
FIG. 5 illustrates a top view of an embodiment of a light emitter device according to the disclosure herein.

FIG. 5 illustrates a second embodiment of an LED device, generally designated 50, which is similar in form and function to LED device 10. LED device 50 can comprise substrate 12 and emission area 16 disposed over substrate 12. Emission area 16 can comprise any suitable size, shape, number and/or be disposed at any suitable location over substrate 12. Retention material 14 can be disposed over substrate 12 and at least partially about emission area 16. LED device 50 can comprise one or more openings or holes 20, disposed through substrate 12 for facilitating attachment of LED device 10 to an external substrate or surface. LED device 50 can comprise first and second symbols 22 and 23 for denoting the electrical polarity of LED device 50. LED device 50 illustrates test point 15 disposed adjacent the positive or side of the device for testing the electrical and/or thermal properties of the LED device 50. LED device 50 further can comprise at least one electrical attachment surface 18 that can electrically connect to one or more external wires (not shown) for facilitating the flow of electric current into emission area 16 of LED device 50.

In one aspect, attachment surface 18 can comprise a shape having curved corners. Rounding the corners, or edges of attachment surfaces 18 may better contain the flow of solder over the device than sharp corners when attaching one or more external conductive wires (not shown) to LED device 50.

Figure 6:
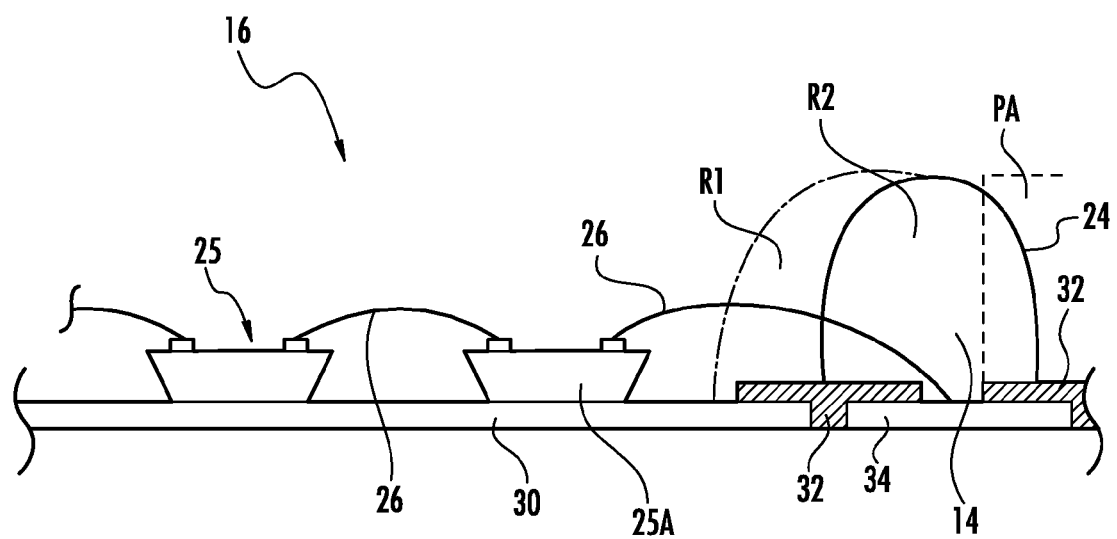
FIG. 6 illustrates a first cross-sectional view of a light emission area of a light emitter device according to the disclosure herein.

FIG. 6 illustrates a portion of a cross-section along an edge of conducting pad 30 of FIGS. 3A and 3B wherein the emission area 16 has not been filled with filling material 40 such as encapsulant and/or phosphors. FIG. 6 illustrates LED chips 25 comprising an outermost LED 25A and adjacent LED for a given string of LED chips within emission area 16. FIG. 7 illustrates a portion of a cross-section of FIG. 1 wherein filling material 40 is disposed over emission area 16. For illustration purposes, four LED chips 25 are illustrated and electrically connected in series in FIG. 7. However, as noted earlier, each string, or pattern of LED chips 25 can comprise any suitable number of LED chips 25. In one aspect, each string of LED chips can comprise 14 LED chips 25. FIGS. 6 and 7 illustrate one or more LED chips 25 connected in series by one or more wirebonds 26. LED chips 25 can be arranged over conducting pad 30 and can thermally communicate directly with conducting pad 30 or indirectly through one or more intervening layers. LED chips 25 can attach to conducting pad 30 or intervening layers using any attachment means known in art. In one aspect, LED chips 25 can attach using solder pastes, epoxies, or flux. Conducting pad 30 can be formed integral as one piece of substrate 12 or can comprise a separate layer disposed over substrate 12. Conducting pad 30 can dissipate heat generated by the one or more LED chips 25.

As FIGS. 6 and 7 further illustrate, the outermost LED chips 25A for a series, string, or pattern of LED chips 25 can electrically communicate or connect to one or more electrical elements. Electrical elements can comprise first and second conductive traces 33 and 34 configured to flow, or supply electrical signal or current to the respective strings of LED chips 25. One of first and second conductive traces 33 and 34 can comprise an anode and the other a cathode. The electrical polarity can be denoted by first and second symbols 22 and 23 (FIG. 1) as discussed earlier. Conducting pad 30 and conductive traces 33 and 34 can comprise any suitable electrical and thermally conductive materials and can comprise either the same or different materials. In one aspect, conducting pad 30 and conductive traces can comprise a layer of copper (Cu) deposited over substrate using any suitable technique. An electrically insulating solder mask 32 can be disposed at least partially between conducting pad 30 and respective conductive traces 33 and 34 such that when solder is used to attach one or more LED chips 25 over conducting pad 30, the solder cannot electrically connect with the conductive traces 33 and 34 thereby causing one or more strings of LED chips 25 to become electrically shorted.

FIG. 6 illustrates various placement areas, positions, or locations of retention material 14 about emission area 16. In one aspect, retention material 14 can be dispensed about at least a portion, or entirely about emission area 16. Conventional devices can comprise a molded as opposed to dispensed dam placed at a location such as prior art location PA shown in broken lines in FIG. 6 and disposed along an edge of where solder mask 32 contacts first conductive trace 34. The present subject matter envisions retention material 14 disposed in areas, positions, or locations R1, R2, and/or any location therebetween. When retention material 14 is disposed in locations R1 or R2, it can be disposed over and cover at least a portion of one or more wirebonds 26 connecting outermost LED chips 25A to electrical elements, such as conductive trace 34. When in location R1, retention material 14 can be disposed at least partially over each of solder mask 32 and wirebond 26 connected to outermost LED 25A for a respective string of LED chips 25. In one aspect, retention material 14 can be disposed entirely over the portion of solder mask 32 disposed between conducting pad 30 and conductive trace 34 and/or entirely over wirebond 26 when in location R1. In another aspect, retention material 14 can be disposed over and at least partially or entirely cover each of the wirebonds 26 of each of the outermost LED chips 25A for each string of LED chips 25 disposed in emission area 16. The retention material can be dispensed in a predetermined location on the substrate 12 for providing a suitable distance between the retention material 14 and the one or more LED chips 25. Notably, when in location R1, retention material 14 can eliminate the need for solder mask 32 as retention material would be disposed between conducting pad 30 and first and/or second conductive traces 33, 34. Location R2 illustrates retention material 14 disposed at least partially over solder mask 32 and at least partially over wirebond 26 of outermost LED 25A. As illustrated, retention material 14 according to the subject matter herein can comprise a substantially rounded or hemispheric shaped cross-section. Rounding retention material 14 can increase the surface area from which light may be emitted and/or reflected.

FIG. 7 illustrates a string of one or more LED chips 25, for illustration purposes four LED chips 25 are shown but strings of LED chips 25 can comprise any suitable number of LED chips, for example, 14 LED chips 25 arranged in series. FIG. 7 illustrates a cross-section of substrate 12 over which LED chips 25 can be mounted or otherwise arranged. Substrate 12 can comprise, for example, conducting pad 30, first and second conductive traces 33 and 34, and solder mask 32 at least partially disposed between conducting pad 30 and each of conductive traces 33 and/or 34. As noted earlier, if retention material is positioned adjacent outermost LED chips 25A, for example in location R1, solder mask 32 between conducting pad 30 and first and second conductive traces 33 and 34 can be eliminated as it would no longer be necessary. Solder mask 32 can be disposed between conductive traces 33 and 34 and attachment surfaces 18 (FIG. 8), the proximal edges of which can be seen in FIG. 7 adjacent retention material 14, adjacent the outer wall 24 of retention material 14. Substrate 12 can further comprise a dielectric layer 36, and a core layer 38. For illustration purposes, substrate 12 can comprise a MCPCB, for example, those available and manufactured by The Bergquist Company of Chanhassan, Minn. Any suitable substrate 12 can be used, however. Core layer 38 can comprise a conductive metal layer, for example copper or aluminum. Dielectric layer 36 can comprise an electrically insulating but thermally conductive material to assist with heat dissipation through substrate 12. FIG. 7 illustrates retention material 14 arranged, for example, in position R2 at least partially over each of solder mask 32 and the wirebond 26 connecting to conductive traces 33 and 34. FIG. 7 illustrates filling material 40 disposed over the one or more LED chips 25. Filling material 40 can be selectively filled to any suitable level higher, lower, or equal to the height of retention material 14. Wirebonds 26 of the outermost LED chips 25A as shown can be at least partially disposed within retention material 14.

FIG. 7 further illustrates examples of first and second heights H1 and H2 of filling material 40 which can be selectively filled within LED device 10. First height H1 can comprise a height at which filling material 40 is disposed over the LED chips 25. The height may vary due to process variability, so an average height above the string of LED chips 25 can be used and controlled for optimal brightness. Second height H2 can comprise a height at which filling material 40 is selectively disposed over a top surface of conducting pad 30. Second height H2 can be controlled, for example, by controlling the location of retention material 14 and whether it assumes location R1, R2 or any position therebetween. Second height H2 can also be controlled by controlling the amount of filling material 40 dispensed into the cavity defined by retention material 14.

Controlling the volume of filling material 40 within the cavity, or dam defined by retention material 14 can affect first and second heights H1 and/or H2 and can notably allow for fine-tuning or micro-tuning the color, or wavelength, of light emitted from LED device 10. Micro-tuning the color of LED devices 10 can therefore ideally increase product yields to 100%. For example, the amount of color affecting components, including but not limited to phosphors, contained in filling material 40 can be selectively added and the first and/or second heights H1, H2 can be selectively controlled by under or over filling the filling material 40 within emission area 16 depending on the wavelength of LED chips 25 used within device 10. Location of retention material 14, for example, locating retention material at R1, R2, or any position or distance therebetween can also affect first and/or second heights H1 and H2.

In some aspects, micro-tuning color can be achieved over multiple devices or on a per device, or package, basis by changing, for example the ratio of volume of phosphor to overall dispense capability volume of filling material 40. The ratio of volume of phosphor to overall dispense capability volume of filling material 40 can be adjusted based on the wavelength bin of LED chips 25 selected for use in a given device to attain the desired overall wavelength output of LED device 10. By manipulating, for example, the diameter of the dam provided by retention material 14 and/or the height of retention material 14, each of which can affect heights H1 and/or H2 and therefore the volume of fill material, the color of individual devices 10 can be micro-tuned thereby attaining higher process yields. Notably, selectively controlling a volume of the fill material such that color-affecting components of the fill material can be fine-tuned allows for light produced by the one or more LED chips to fall within a predetermined and precise color range.

FIG. 8 illustrates LED device 10 comprising substrate 12 prior to arranging, dispensing, or otherwise placing retention material 14 about at least a portion of emission area 16. For illustration purposes, only a first string of LED chips 25 is illustrated, however, as noted earlier, emission area can comprise more than one string of LED chips 25 electrically connected in series. In one aspect, LED device 10 comprises 10 strings of LED chips 25 connected in series. As illustrated, prior to placing retention material 14, substrate 12 can comprise first and second conductive traces 33 and 34 arranged in a substantially circular arrangement about conducting pad 30 such that LED chips arranged over conducting pad 30 can electrically communicate to each trace by wirebonding and wirebonds 26 or by any other suitable attachment method. As illustrated, outermost LED chips 25A for a respective string of LED chips 25 can electrically connect to conductive traces.

At least one gap 42 can exist between conductive traces 33 and 34. LED device 10 and devices disclosed herein can further comprise elements to protect against damage from ESD positioned, or disposed in the gap 42. In one aspect, different elements can be used such as various vertical silicon (Si) Zener diodes, different LED chips arranged reverse biased to LED chips 25, surface mount varistors and lateral Si diodes. In one aspect, at least one Zener diode 44 can be disposed between ends of first and second conductive traces 33 and 34 and reversed biased with respect to the strings of LED chips 25. In one aspect, two Zener diodes 44 can be electrically connected in series using one or more wirebonds 46 between first and second conductive traces 33 and 34 for higher voltage applications. As Zener diodes 44 are typically black and absorb light, placing the at least one Zener diode 44 in gap 42 between conductive traces 33 and 34 and also beneath retention material 14 can further improve light output intensity.

FIG. 8 also illustrates one possible location for conducting pad 30. That is, conducting pad 30 can comprise a substantially centrally located circular pad disposed between conductive traces 33 and 34. Conducting pad 30 however, can be located at any suitable location over substrate and any location other than substantially center the device. Solder mask 32 can be disposed at least partially between respective conductive traces and conducting pad 30, such that the solder mask 32 comprises a substantially circular arrangement about conducting pad 30. Solder mask 32 can also be disposed in areas outside of the conductive traces, for example, between the respective conductive traces and one or more attachment surfaces 18. Broken lines 52 illustrate one possible aspect of the size and/or shape of conducting material comprising the conductive traces 33 and 34. The lines are broken to illustrate how the material can be disposed under solder mask 32. Thus, attachment surfaces 18 electrically and/or thermally communicate with respective conductive traces, and can comprise the same layer of material. External, conductive wires (not shown) can electrically connect to attachment surfaces 18, and electrical current or signal can flow from the attachment surfaces 18 to the respective conductive traces. The electrical current can flow along the conducting material designated by dotted lines 52 disposed below the layer of solder mask 32. The electrical current can flow into and/or out of the conductive traces and therefore into and out of respective strings of LED chips 25 mounted over conducting pad 30.

As noted earlier, Zener diodes 44 are typically black and absorb light. FIG. 9 illustrates Zener diode 44 upon placement of the retention material. In one aspect, retention material 14 can be disposed at least partially over the at least one Zener diode 44. In another aspect, retention material 14 can be disposed entirely over the at least one Zener diode 44 such that the diode is completely covered for further improving light output intensity. Zener diode 44 can be disposed over an electrically and/or thermally conducting surface or area 54 such that current can flow through the diode 44, into the wirebonds 46, and to respective conductive traces 33 and 34.

LED devices disclosed herein can advantageously consume less energy while delivering equal or greater illumination. In one aspect, when used in traditional down light applications, luminaires based on LED devices 10 and/or 50 can deliver 38% more illumination than a 26-watt CFL or a 100-watt incandescent bulb, while consuming only 14 watts. In one aspect, LED device 10 can enable a 60-watt A-lamp equivalent while consuming only 11 watts. LED device 10 can comprise a light output of 1050 lumens at 11 watts, or 2000 lumens at 27 watts, with a 3000-K warm white color temperature.

Figure 10:
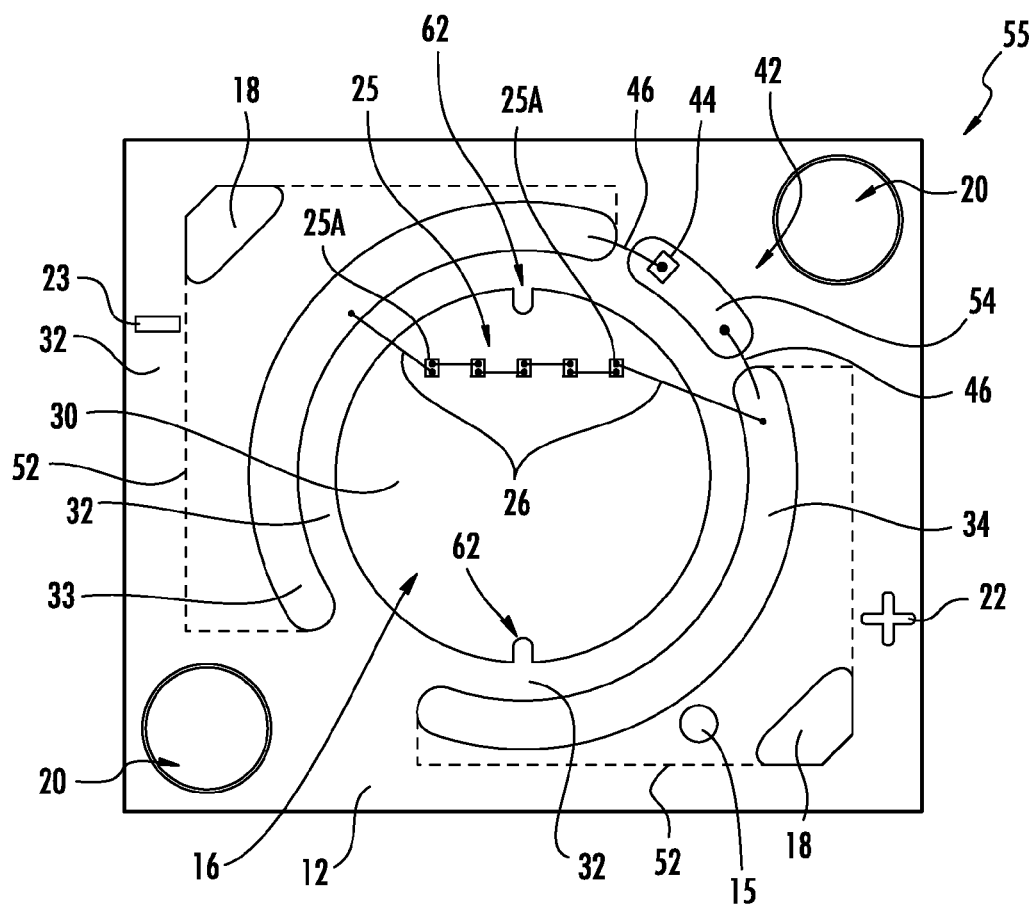
FIG. 10 illustrates a top view of a light emitter device according to the disclosure herein.

FIG. 10 illustrates another embodiment of an LED device, generally designated 55. LED device 55 illustrates substrate 12 prior to arranging, dispensing, or otherwise placing retention material 14 (FIG. 11) about at least a portion of emission area 16. For illustration purposes, only a first string of LED chips 25 is illustrated, however, emission area can comprise more than one string of LED chips 25 electrically connected in series. Each string of LED chips 25 can comprise the same or a different pattern. LED device 60 is similar in form and function to LED device 10 previously described with respect to FIG. 8. For example, prior to placing retention material 14, substrate 12 can comprise first and second conductive traces 33 and 34 arranged in a substantially circular arrangement about conducting pad 30 such that LED chips arranged over conducting pad 30 can electrically communicate to each trace by wirebonding via wirebonds 26 or any other suitable attachment method. As illustrated, outermost LED chips 25A for a respective string of LED chips 25 can electrically connect to the conductive traces. In fact, for LED devices described herein, emission area 16 can comprise a single, undivided mounting area at least partially defined by outermost LED chips 25A; with the outermost LED chips 25A being wirebonded via wirebonds 26 to contact areas, such as conductive traces 33 and 34. LED chips 25 that are not the outermost LED chips 25A are wirebonded via wirebonds 26 in strings having one or more patterns or arrays.

At least one gap 42 can exist between conductive traces 33 and 34. In this embodiment, one or more ESD protection device or Zener diode 44 can be disposed in gap 42 and can be electrically connected, or mounted to conductive area 54. In this embodiment, conductive area 54 can comprise an area larger than a footprint of Zener diode 44. Zener diode 44 can be positioned over conductive area 54 between ends of first and second conductive traces 33 and 34. Zener diode 44 can be reversed biased with respect to the one or more strings of LED chips 25. For example, when one Zener diode 44 is used, one or more wirebonds 46 can connect conductive area 54 to one of first and second conductive traces 33 and 34 such that Zener diode 44 can be reverse biased with respect to the strings of LED chips 25. As Zener diodes 44 are typically black and absorb light, placing the at least one Zener diode 44 in gap 42 between conductive traces 33 and 34 and also beneath retention material 14 (FIG. 9) can further improve light output intensity.

FIG. 10 also illustrates one possible location for test point 15. Test point 15 can be disposed within the area marked by broken lines 52 which correspond to conducting material disposed under solder mask. Broken lines 52 illustrate one possible aspect of the size and/or shape of the conducting material which can be deposited on or in substrate 12 for electrically coupling conductive traces 33 and 34 and attachment surfaces 18. The electrical coupling allows electrical current to be communicated from attachment surfaces 18 to the one or more strings of LED chips 25 electrically connected to traces 33 and 34. The lines are broken to illustrate how the material can be disposed under solder mask 32. Thus, test point 15 and attachment surfaces 18 electrically and/or thermally communicate with respective conductive traces, and can comprise the same layer of material. Solder mask 32 can be deposited or disposed at least partially between respective conductive traces and conducting pad 30, such that the solder mask 32 comprises a substantially circular arrangement about conducting pad 30. Conductive pad 30 can comprise one or more marks or notches 62 for orientation purposes and for proper alignment of retention material 14.

Solder mask 32 can also be deposited in areas outside of the conductive traces, for example, between the respective conductive traces and one or more attachment surfaces 18 and/or test point 15. External, conductive wires (not shown) can electrically connect to attachment surfaces 18, and electrical current or signal can flow from the attachment surfaces 18 to the respective conductive traces. The electrical current can flow along the conducting material designated by dotted lines 52 disposed below the layer of solder mask 32. The electrical current can flow into and/or out of the conductive traces and therefore into and out of respective strings of LED chips 25 mounted over conducting pad 30. In one aspect, test point 15 can allow electrical properties of the device to be tested when probed with an electrically conductive test wire or device (not shown).

The arrangement illustrated by FIG. 10, i.e., the location of conductive traces 33 and 34, conductive area 54, Zener diode 44, and test point 15 prior to placing retention material 14 can correspond to any one of the previously described LED devices e.g., 10 and 50 or any of the devices described in FIGS. 11-14. For example, LED devices described in FIG. 11-14 can comprise at least one opening or hole, generally designated 20, that can be disposed through or at least partially through substrate 12 for facilitating attachment of the LED devices to an external substrate or surface. In addition first symbol 22 and second symbols can be used to denote the portions of the LED devices comprising positive and negative electrode terminals. One or more test points 15 can be located adjacent either a positive or negative side of the device for testing the electrical and/or thermal properties of the LED devices.

Figure 11:
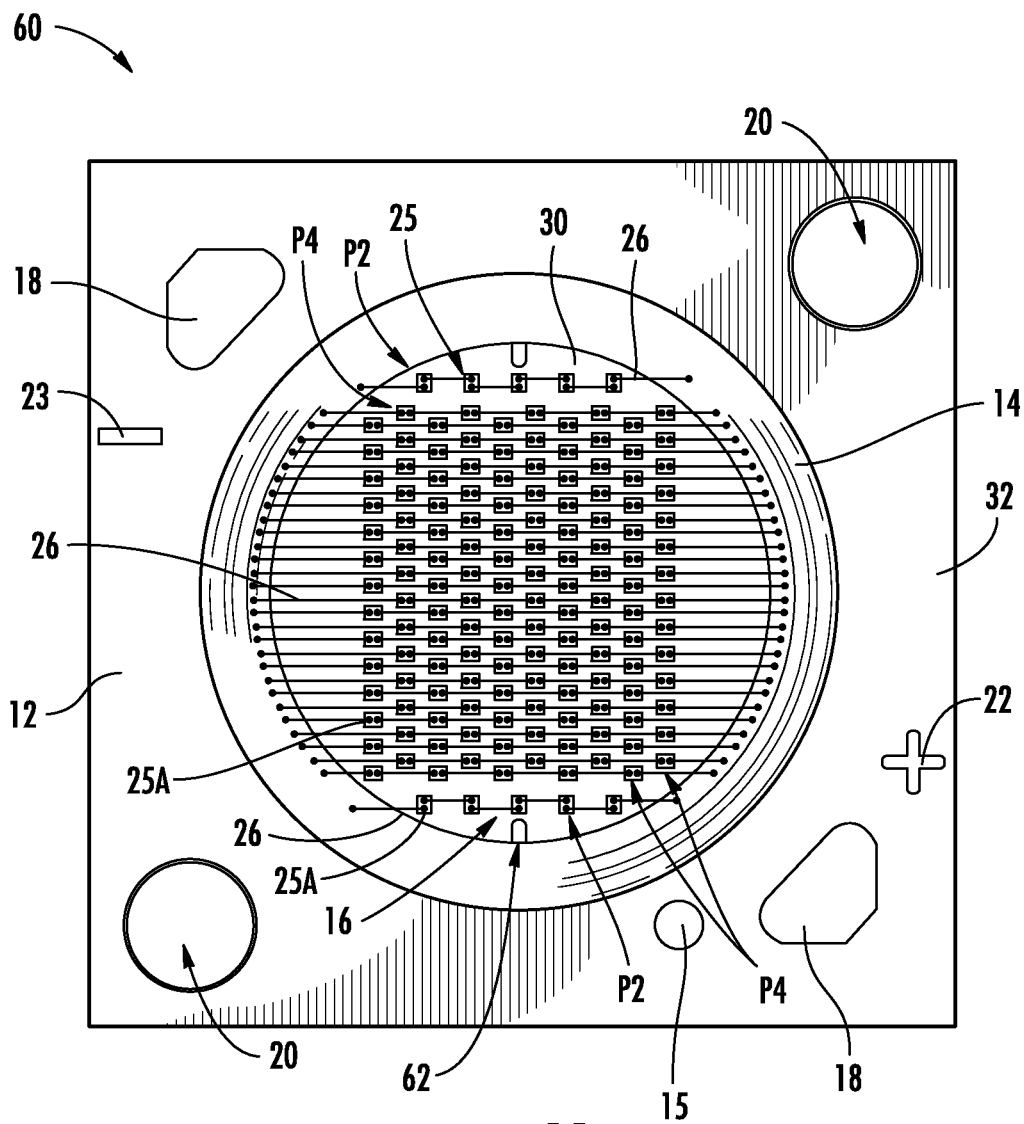
FIGS. 11 to 14B illustrate top views of embodiments of a light emitter device having one or more patterns of LED chips according to the disclosure herein.

FIGS. 11 to 14 illustrate top views of different embodiments of LED devices. Such devices may be similar in many aspects to previously described LED devices 10 and 50, but can also be useful for a range of low and/or high voltage applications in addition to attaining different light output by pattern variation. For example, FIG. 11 illustrates one embodiment of an LED device, generally designated 60 which can be used in lower voltage applications. In one aspect and for example only without limitation, LED device 60 can be operable at approximately 16 V. In one aspect, LED device 60 can be operable at less than approximately 16 V, for example, 14 to 16 V. In one aspect, LED device 60 can be operable at more than approximately 16 V, for example, 16 to 18 V. In one aspect, using more than 140 LED chips 25, e.g., more than LED device 10 and changing the pattern of LED chips 25 can allow LED device 60 to be operable at lower voltage applications. In one aspect, the pattern can be changed by electrically connecting less than 14 LED chips 25 together in a series or string.

FIG. 11 illustrates at least two sets of LED chips arranged in two patterns forming a reticulated array of LED chips 25 within emission area 16. For example, a first set of LED chips can comprise second pattern P2, previously described. A second set of LED chips can comprise a fourth pattern P4. Each pattern can comprise, for example, 30 strings of five LED chips 25 electrically connected in series. That is, fewer than 14 (FIGS. 3A, 3B) LED chips 25 can be electrically connected in series in a given string. The first and last strings of LED chips 25 can comprise five LED chips 25 electrically connected in series according to previously described second pattern P2. The second to twenty-ninth strings can comprise another pattern different from the first and thirtieth strings. For example, FIG. 11 illustrates five LED chips 25 electrically connected in series according to pattern P2, the strings can be disposed on conducting pad 30 proximate one or more rounded outer edges of emission area 16. LED chips 25 arranged in the first and thirtieth strings can, for example and without limitation, be spaced equidistant from each other and uniformly across emission area 16 according to pattern P2. LED chips 25 arranged in pattern P2 can comprise a straight line arrangement in which longer axes of LED chips 25 are substantially parallel. The shorter axes of LED chips 25 in pattern P2 can also be at least substantially parallel. Longer axes of LED chips 25 arranged in pattern P2 can be aligned perpendicular to wirebonds 26. In addition, longer axes of LED chips 25 arranged in pattern P2 can be perpendicular to longer axes of LED chips 25 arranged in adjacent patterns, e.g., pattern P4.

In one aspect, pattern P4 can comprise five LED CHIPS 25 electrically connected in series across conducting pad 30. Pattern P4 can comprise a straight line of LED chips, and each of the five LED chips 25 can be positioned such that longer axes of LED chips 25 are substantially aligned along a straight line. In one aspect, longer axes of each LED 25 can be aligned in a same direction as the direction of wirebonds 26 connecting the LED chips 25 to conductive traces 33 and 34 disposed below retention material 14. Adjacent strings, e.g., adjacent strings in the second through twenty-ninth strings of LED chips 25 connected in pattern P4 can alternate above and below a straight line such that LED chips 25 form a substantially checkerboard type arrangement. That is, a first string of LED chips 25 arranged in pattern P4 (i.e., the second overall string of LED chips 25 disposed below the first string comprising pattern P2) can comprise five LED chips 25 spaced equidistant apart, leaving a space in between adjacent LED chips 25.

In the alternative, LED chips 25 in pattern P4 could be wirebonded in a checkerboard arrangement, but that could increase the voltage at which device 60 is operable. Below the first string of LED chips 25 arranged in pattern P4, a subsequent string of LED chips 25 arranged in pattern P4 can be positioned or placed such that LED chips 25 are substantially within and/or slightly below the space between adjacent LED chips 25 of the preceding string. That is, LED chips 25 arranged in pattern P4 can comprise a first string aligned such that a bottom edge of each LED 25 in the string is aligned along a same first straight line. LED chips 25 in a neighboring subsequent string of pattern P4 can be aligned such that a top edge of each LED 25 is also aligned along the same first straight line as the bottom edge of LED chips 25 in the preceding string. Thus, LED chips 25 of preceding and subsequent strings alternate above and/or below spaces between adjacent LED chips 25 in a given string, and the top and bottom edges of LED chips 25 in adjacent strings can be aligned along a same line. This arrangement comprises a substantially checkerboard shaped orientation which can advantageously allow LED chips 25 to uniformly emit light from LED device 60 without one or more adjacent LED chips blocking light.

Additional strings of LED chips 25 arranged in pattern P4 can alternate according to the first two strings just described. Strings of LED chips 25 comprising pattern P4 can comprise a same or similar width over emission area 16. That is, each adjacent LED 25 of a given string can be spaced apart at equidistant lengths, but the overall string length may not be uniformly across emission area 16. Rather, LED chips 25 can be spaced such that the second to twenty-ninth rows form a substantially reticulated array over emission area 16. In one aspect, LED chips 25 form a rectangular array over emission area 16 which utilizes a substantially uniform portion of horizontal segments, or chords of conducting pad 30. In one aspect, LED device 60 can comprise at least one group of LED chips 25 arranged in more than one string of LED chips, where the overall configuration can be in a predetermined geometrical shape, such as for example and without limitation, a rectangle. Any suitable number of LED chips 25 may be connected in series. Fewer number of LED chips 25, for example five LED chips 25 connected in series as illustrated in FIG. 11 can allow LED device 60 to be suitable for lower voltage applications, for example 16 V applications. For illustration purposes, 30 strings of five LED chips 25 arranged in one or more patterns are illustrated for operation at lower voltages, however, any suitable number of strings and/or LED chips 25 electrically connected in series is contemplated.

LED device 60 can comprise outermost LED chips 25A electrically connected via electrical connectors such as wirebonds 26 to conductive traces 33, 34 (FIG. 10). Retention material 14 can then be dispensed at least partially about conducting pad 30 and at least partially over wirebonds 26. Retention material 14 can be dispensed about emission area 16 which can comprise a plurality of LEDs, or LED chips 25 disposed within and/or below filling material 40 such as illustrated in FIG. 7. Filling material 40 can be at least partially contained by retention material 14, and retention material can be used to control or adjust various heights of filling material as may be desirable. Notably, LED device 60 can comprise a uniform optical source in the form of single, cohesive, and undivided emission area which can simplify the manufacturing process for manufacturers of light products requiring a single component. LED chips 25 can be spaced a suitable distance apart such that device 60 can advantageously emit uniform light without having any light blocked by one or more adjacent LED chips 25.

The patterns and pattern spacing (i.e., spacing between adjacent LED chips 25 and spacing between adjacent strings of LED chips 25) disclosed for example in LED devices 10 and 60 allow for optimization of light extraction by reducing the amount of light blocked by adjacent LED chips 25 and adjacent strings of LED chips 25. The pattern spacing disclosed for example in LED devices 10 and 60 can further be configured and expanded, for example, by increasing the spacing between adjacent LED chips 25 (e.g., to pattern spacing illustrated in FIGS. 12-14B) to maximum spacing within a given string and between one or more strings to further maximize and attain a higher efficiency and light extraction within a given LED device.

Figure 12:
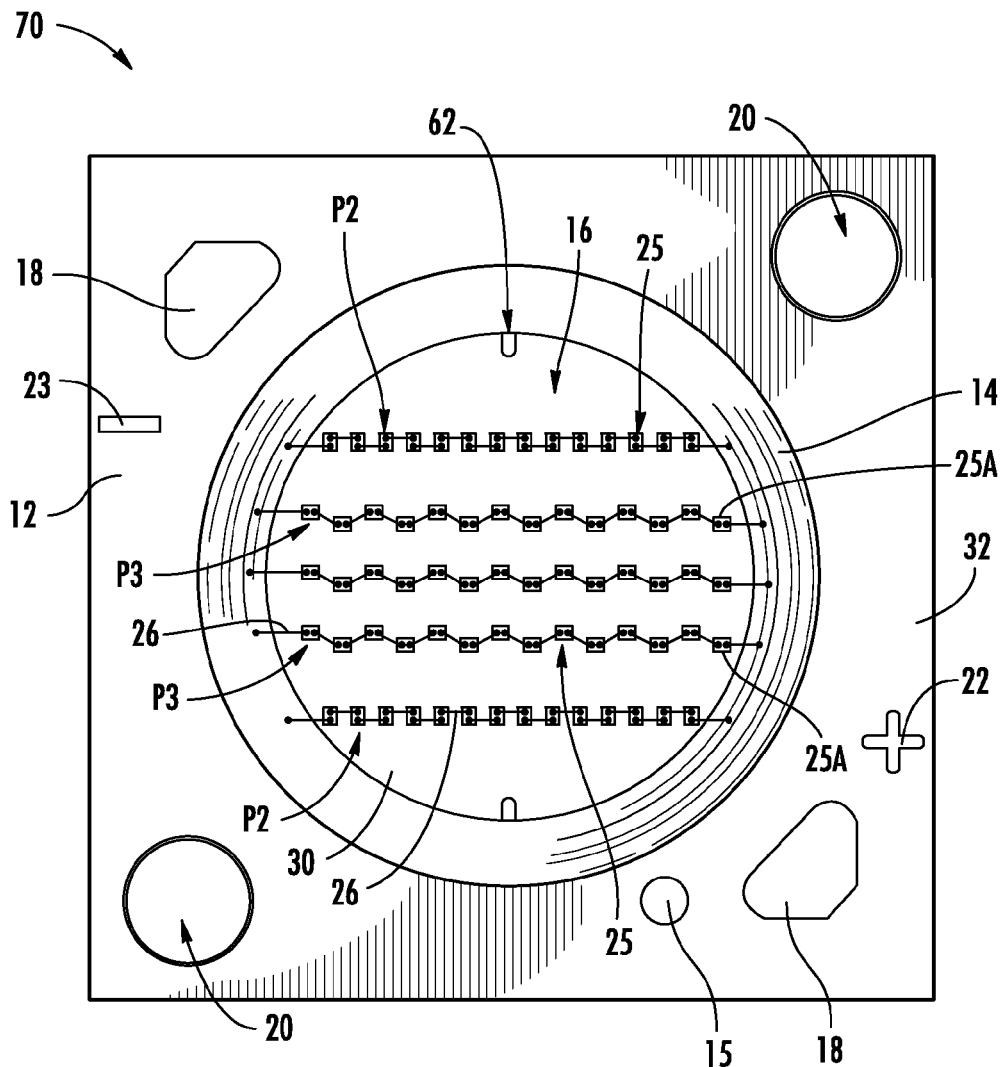

FIGS. 12 to 14B illustrate top views of LED devices which can be operable at higher voltages such as, for example only and not limited to approximately 42 V. In one aspect, LED devices illustrated by FIGS. 12 to 14B can comprise more than five LED chips 25 per string such that the device is configured to operate at greater than approximately 16 V. FIG. 12 illustrates an LED device generally designated 70 having, for example, five strings of 14 LED chips 25. LED device 70 can comprise strings of LED chips 25 arranged in one or more different patterns. For example, the first and last strings proximate rounded edges of conducting pad 30 can comprise 14 LED chips 25 arranged in previously described pattern P2. The longitudinal axes of adjacent LED chips 25 in pattern P2 can be aligned such that they are at least substantially parallel. The longitudinal axes of adjacent LED chips 25 in pattern P2 can be at least substantially perpendicular to the direction of wirebonds 26 connecting adjacent LED chips 25. For each LED device described, any shape, orientation, or structure of LED chips is contemplated. In one aspect, LED device 70 can comprise 70 total LED chips 25.

Still referring to FIG. 12, strings of LED chips 25 disposed between outermost strings of second pattern P2 can comprise a different pattern, for example, third pattern P3 previously described in FIGS. 3A and 3B. Third pattern P3 can comprise a substantially checkerboard pattern or arrangement of LED chips 25 electrically connected in series. In one aspect, pattern P3 can be disposed between and/or alternate with strings of LED chips having second pattern P2. The checkerboard pattern or third pattern P3 can comprise a set of LED chips 25 alternating both above and below a horizontal line. LED device 70 can be disposed uniformly across emission area 16 and/or conducting pad 30, for example. In general, adjacent LED chips 25 in each of the strings of LED device 70 can be spaced at equidistant intervals to utilize a substantial portion of horizontal segments of conducting pad 30. That is, LED chips 25 in device 70 can occupy a greater amount of surface area and length of horizontal segments of conducting pad 30 than previously described LED device 60. For illustration purposes, five strings of 14 LED chips 25 arranged in two different patterns are illustrated, however, any suitable number of strings and/or LED chips 25 electrically connected in series is contemplated.

Figure 13A:
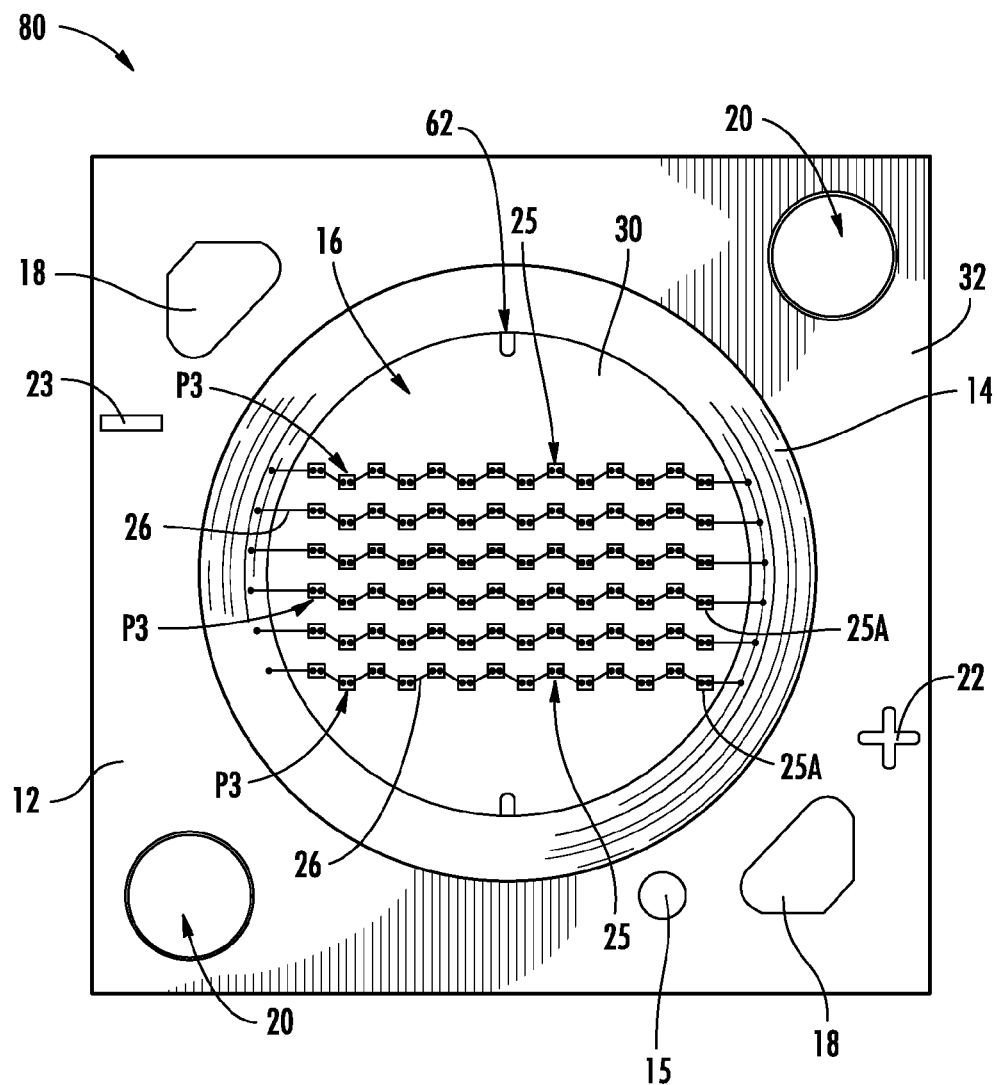
Figure 13B:
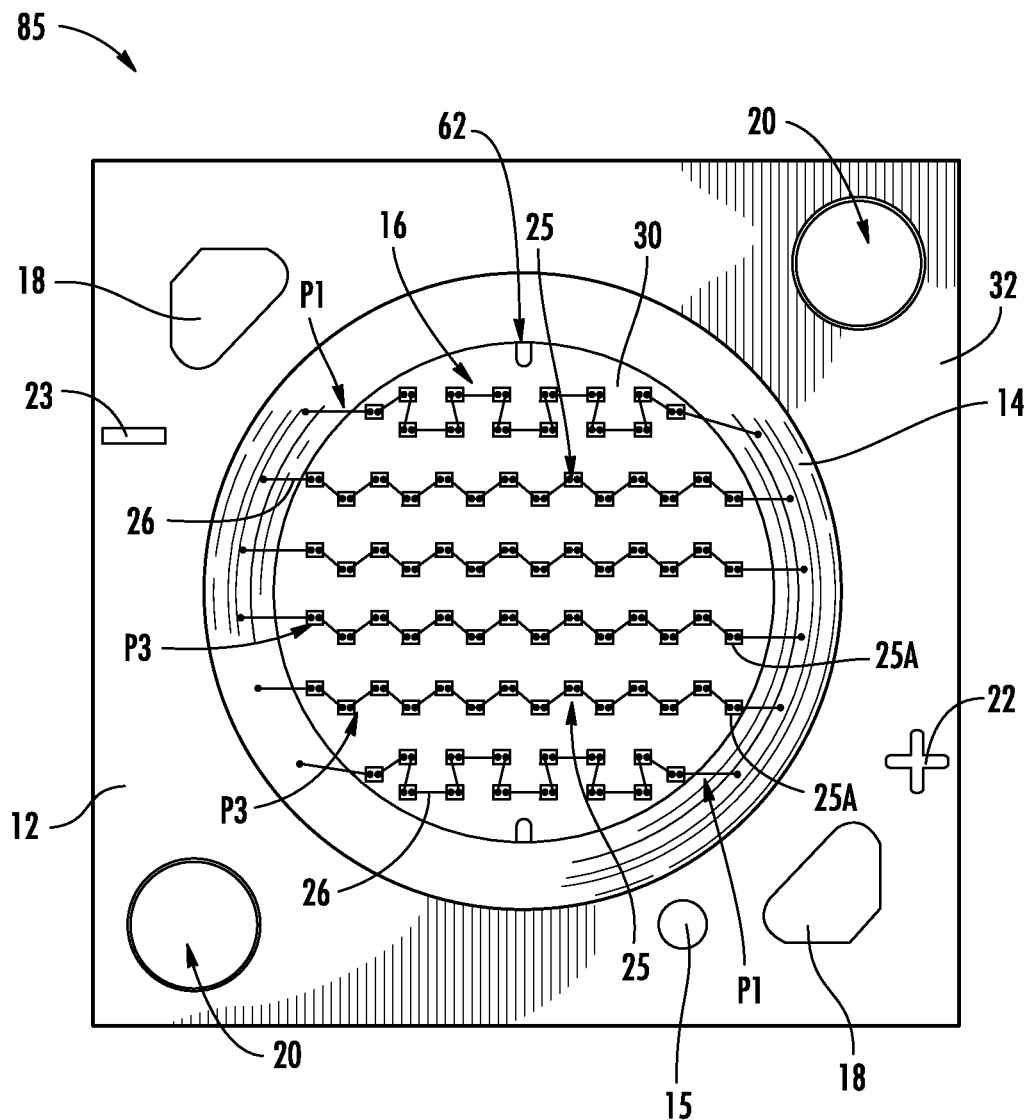

FIGS. 13A and 13B illustrate further embodiments of LED devices. In one aspect, LED devices in FIGS. 13A and 13B comprise six strings of 14 LED chips 25, for a total of 84 LED chips 25. Referring to FIG. 13A, LED device, generally designated 80 can comprise one or more strings of LED chips 25 arranged for example in a single pattern across conducting pad 30. The one or more strings of device 80 can have the same and/or different patterns. For illustration purposes, previously described pattern P3 is illustrated. LED chips 25 can be arranged in a checkerboard pattern alternating above and below a horizontal line. Adjacent LED chips 25 can be spaced a substantially uniform distance from each other across a large portion of the surface area of conducting pad 30. Checkerboard arrangements, e.g., pattern P3 can advantageously allow the LED chips 25 to uniformly emit light from LED device 80 without one or more adjacent LED chips 25 blocking light.

FIG. 13B illustrates another embodiment of a six string LED device, generally designated 85. Like LED device 80, LED device 85 can comprise six strings of 14 LED CHIPS 25. Spacing between adjacent LED chips 25 within the same string and adjacent LED chips 25 within different strings has been maximized to minimize the amount of light absorbed by adjacent LED chips. In one aspect, LED device 85 comprises previously illustrated first pattern P1 (FIG. 3A) as the first and last strings. Notably, LED chips 25 of patterns P1 and P3 extend at least substantially the full length and width of conducting pad 30. The second through fifth strings of LED chips 25 within LED device 85 comprise pattern P3. When comparing the six string arrangement of FIG. 13A to the six string arrangement of FIG. 13B, it is apparent that the strings of FIG. 13B are more spread out, i.e., vertically and horizontally spaced further apart on conducting pad 30 to utilize more of the mounting area. Maximizing the space between strings of LED chips 25 can minimize the amount of light absorbed or blocked by neighboring LED chips 25.

In one aspect, inter-string spacing, that is, spacing between adjacent LED chips 25 of the same string has been increased by at least approximately 31%, or by 125 µm, or greater in the vertical direction for pattern P3 from LED device 80 to LED device 85. Similarly, inter-string spacing of LED chips 25 in pattern P1 has been increased and/or optimized in both the horizontal and vertical directions. For example, spacing has been increased approximately 41%, or by 225 µm, or greater, in the horizontal direction and by at least approximately 27%, or by 210 µm, or greater in the vertical direction from P1 in LED device 10 to P1 in LED device 85. Intra-string spacing i.e., spacing between LED chips 25 of adjacent strings can be increased by at least approximately 68%, or by 750 µm, or greater in LED device 85. Notably, although LED device 85 can comprise the same number of LED chips 25 as LED device 80, e.g., 84 LED chips, LED device 85 can comprise at least approximately a 1% to 3%, or greater, increase in efficiency and brightness when compared to LED device 80. In one aspect, increasing the spacing between adjacent LED chips 25 as described can increase the efficiency by at least approximately 2.5% or greater from one six string arrangement to another, e.g., LED device 85 can comprise a 2.5% or greater increase in efficiency over LED device 80. For example, LED device 85 can have a light output of at least approximately 2.5% or higher than the light output of LED device 80 described above, which can comprise approximately 1050 lumens or more at 11 watts, or approximately 2000 lumens or more at 27 watts.

Figure 14A:
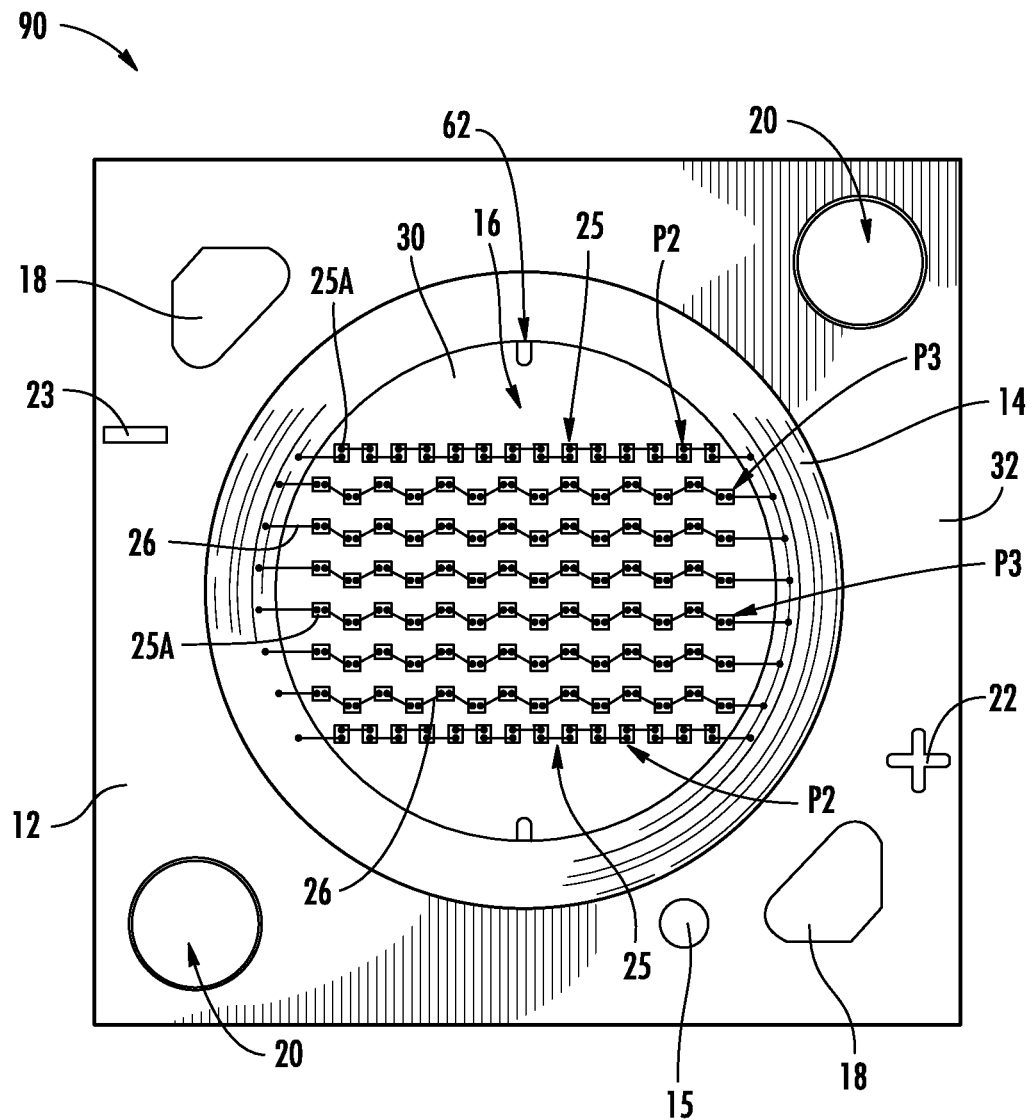
Figure 14B:
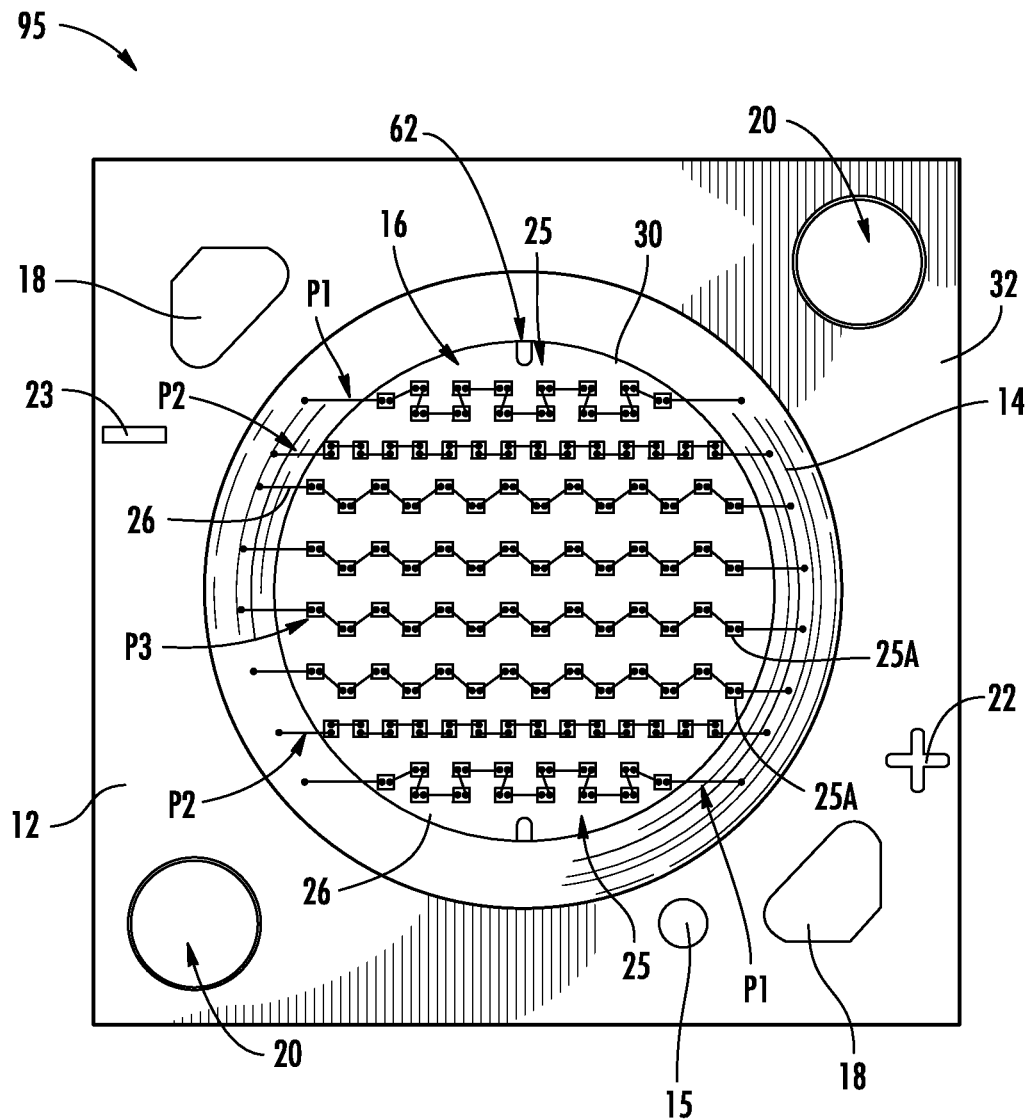

FIGS. 14A and 14B illustrate further embodiments of LED devices. In one aspect, the LED devices in FIGS. 14A and 14B comprise eight strings of 14 LED chips 25. Referring to FIG. 14A, an LED device generally designated 90 is illustrated, and can be operable at higher voltages, not limited to greater than or equal to approximately 42 V. LED device 90 can comprise one or more strings of LED chips 25 arranged in one or more patterns across emission area 16 and/or conducting pad 30. In one aspect, LED device 90 can comprise eight strings of LED chips 25 arranged in more than one pattern. Each string of LED chips 25 can comprise 14 LED chips 25, or 112 total LED chips. In one aspect, the first and last strings can comprise previously described pattern P2. The second through seventh strings of LED chips 25 can comprise previously described pattern P3. Notably, LED devices illustrated by FIGS. 11 to 14B can comprise a uniform optical source in the form of single, cohesive, and undivided emission area which can simplify the manufacturing process for manufacturers of light products requiring a single component.

FIG. 14B illustrates another embodiment of an eight string LED device, generally designated 95. Like LED device 90, LED device 95 can comprise eight strings of 14 LED CHIPS 25. Spacing between adjacent LED chips 25 within the same string and adjacent LED chips 25 within different strings has been maximized to minimize the amount of light absorbed by adjacent LED chips. In one aspect, LED device 95 can comprise previously illustrated first pattern P1 (FIG. 3A) as the first and last strings. The second and seventh strings can comprise pattern P2, and the third through sixth strings can comprise pattern P3. Notably, LED chips 25 of patterns P1, P2, and P3 extend at least substantially the full length and width of conducting pad 30. LED chips 25 of P1, P2, and P3 can be spaced further apart horizontally and/or vertically such that an amount of light blocked by adjacent LED chips 25 can be decreased. In one aspect, pattern P1 spacing has been increased at least approximately 41%, or by 225 µm, or greater in the horizontal direction and by at least approximately 27%, or by 210 µm, or greater in the vertical direction from P1 in LED device 10 to P1 in LED device 95. Similarly, horizontal and/or vertical spacing between LED chips 25 in pattern P2 can be increased at least approximately 4% or greater over P2 in LED device 90. Intra-string spacing i.e., spacing between LED chips 25 of adjacent strings can be increased by at least approximately 68%, or by 750 µm, or greater in LED device 95. Notably, although LED device 95 can comprise the same number of LED chips 25 as LED device 90, e.g., 112 LED chips, LED device 95 can have at least an approximate 1% to 2%, or greater, increase in efficiency and brightness when compared to LED device 90.

In one aspect, LED devices 10, 60, 70, 80, and 90 disclosed by FIGS. 3A, 3B, and 11 to 14B can comprise a large quantity of LED chips 25 arranged in one or more patterns over conducting pad 30. In one aspect, LED devices disclosed herein comprise a quantity of more than 64 LED chips 25. For example, in one aspect without limitation, LED device 10 can comprise 140 total LED chips, or 10 strings of LED chips 25 electrically connected in series. LED device 60 can comprise 150 total LED chips, or 30 strings of five LED chips 25 electrically connected in series. LED device 70 can comprise 70 total LED chips, or five strings of 14 LED chips 25. LED device 80 can comprise 84 total LED chips, or six strings of 14 LED chips 25. LED device 90 can comprise 112 total LED chips, or eight strings of 14 LED chips 25. LED chips 25 used in LED devices described herein can comprise a small footprint, or surface area when compared to conducting pad 30. For example and without limitation, LED chips 25 can comprise chips of the following dimensions in Table 1 below:

TABLE 1

| LED chip size | |
|---|---|
| Length (µm) | Width (µm) |
| 350 | 470 |
| 230 | 660 |
| 500 | 500 |
| 520 | 700 |

In one aspect and without limitation, conducting pad 30 can comprise a radius of approximately 6.568 mm and an area of approximately 135.7 mm². Thus, the ratio of the area of a single LED chip 25 and the area of conducting pad 30 can comprise approximately 0.0027 or less. In one aspect, the ratio of the area of a single LED chip 25 and the area of conducting pad 30 can comprise approximately 0.0018 or less. In other aspects, the ratio can comprise approximately 0.0012 or less. Table 2 below lists various LED 25 chip sizes and the area of conducting pad 30. LED chips 25 can comprise chips that are small compared to the area of conducting pad, that is, approximately 0.0027 of the area of the conducting pad or less. Any chip size may be used however.

TABLE 2

| Chip Size (µm) | Conducting Pad Area (mm) | Ratio of Chip Area to Conducting Pad Area |
|---|---|---|
| 350 × 470 | 135.7098 | 0.0012 |
| 230 × 660 | 135.7098 | 0.0011 |
| 500 × 500 | 135.7098 | 0.0018 |
| 520 × 700 | 135.7098 | 0.0027 |

Using a large quantity of LED chips 25 comprising a smaller footprint over a single emission area can advantageously allow for more uniform light output in addition to desirable optical properties such as high brightness as the LED chips 25 can be arranged into one or more uniform patterns over a portion of emission area 16. The concentrated patterns of LED chips 25 can allow for concentrated light emission. In one aspect, the density or spacing of LED chips 25 in the one or more patterns described herein can be adjusted such that light will not be absorbed or blocked by adjacent LED chips 25. That is, patterns and arrangements of LED chips 25 disclosed herein may improve light extraction by minimizing the amount of light absorbed by adjacent or neighboring LED chips 25. The number of LED chips 25 per string can allow LED devices to be operable at low to high voltages. For illustration purposes, four patterns have been illustrated. However, any suitable pattern of LED chips 25 is contemplated. Each string of LED chips 25 can comprise a single pattern or a combination of more than one pattern.

Figure 15A:
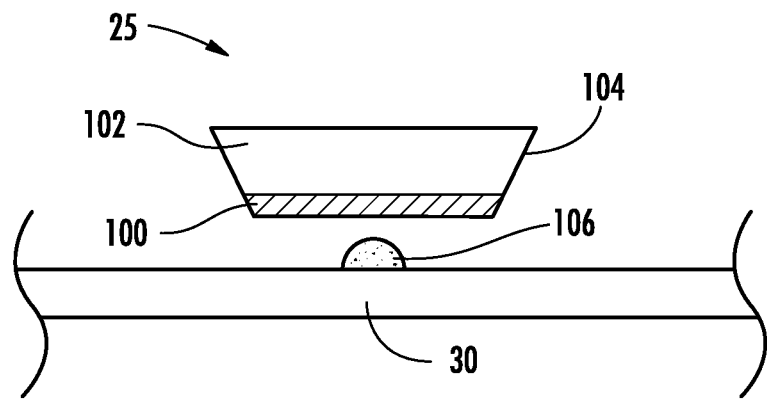
FIGS. 15A and 15B illustrate die attach of LED chips within LED devices according to the disclosure herein.
Figure 15B:
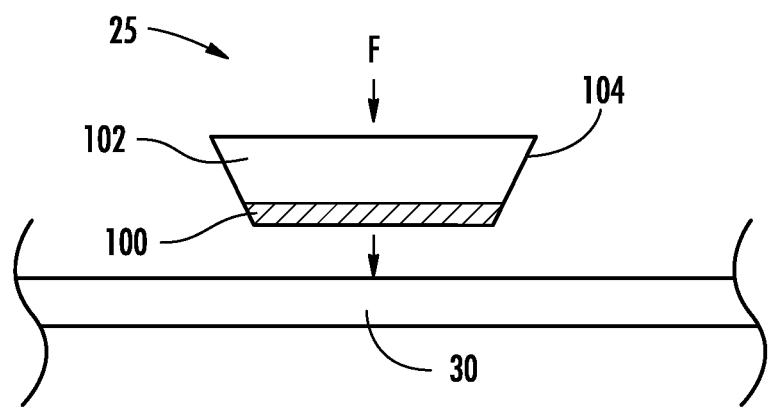

FIGS. 15A and 15B illustrate methods of die attach that can, for example and without limitation, be used for LED devices according to the disclosure herein. LED 25 can comprise a backside metal pad or bonding layer 100 for directly attaching or mounting to conducting pad 30. Bonding layer 100 can comprise a length of the entire bottom surface LED 25 or a portion thereof. For illustration purposes, bonding layer 100 is illustrated as having a same length as the entire bottom surface of LED 25; however, any configuration is contemplated. LED 25 can comprise lateral sides 104 which can extend between an upper surface and the bottom surface of LED 25. FIGS. 15A and 15B illustrate inclined lateral sides 104; however, lateral sides 104 can be substantially vertical or straight where a straight-cut LED is selected. FIGS. 15A and 15B illustrate LED chips 25 having an upper surface of a greater surface area than an area of bottom surface comprising bonding layer 100. However, upper surface can be of a smaller surface area than the surface area of bonding surface. LED chips 25 can comprise a square, rectangle, or any suitable shape in addition to having any suitable lateral side configuration.

Any suitable die attach method can be used to mount LED 25 over conducting pad 30 in any of the LED devices previously described. In one aspect, any suitable optimized die attach method and/or materials can be used. For example, optimized die attach methods can comprise metal-to-metal die attach methods for facilitating attachment of one or more metals on and/or between LED 25 and conducting pad 30. FIG. 15A illustrates an example of a metal-to-metal die attach method which can be eutectic or non-eutectic. This metal-to-metal die attach method can comprise using an assist material 106 to facilitate the metal-to-metal die attach.

In one aspect, a flux-assisted eutectic metal-to-metal die attach method can be used and in other aspects a metal-assisted non-eutectic metal-to-metal die attach method can be used. In a flux-assisted eutectic, or flux eutectic, die attach method, bonding layer 100 can comprise a metal alloy having a eutectic temperature, for example, but not limited to, an alloy of gold (Au) and tin (Sn). For example, bonding layer 100 can comprise an 80/20 Au/Sn alloy having a eutectic temperature of approximately 280° C. In the flux eutectic technique, assist material 106 can comprise a flux material. In the non-eutectic technique, assist material 106 can comprise a metallic material. The assist material 106 can comprise a conduit for facilitating the metal-to-metal die attach between the bonding layer 100 and conducting pad 30 when the bonding layer 100 is heated above the eutectic temperature. The metal of bonding layer 100 can flow into and attach to the metal of conducting pad 30. The metal of bonding layer 100 or can atomically diffuse and bond with atoms of the underlying mounting conducting pad 30. In one aspect, flux used in a flux-assisted eutectic method can comprise a composition, for example, 55-65% rosin and 25%-35% polyglycol ether in addition to small amounts of other components. Any suitable flux material can be used however.

Flux-assisted eutectic die attach methods can be tedious, and it is unexpected to use such methods when attaching a large quantity of LED chips 25 in predetermined arrangements and/or an array. Flux eutectic die attach according to the present subject matter can comprise dispensing flux assist material 106, that can be liquid at room temperature, in an amount to be precisely the right volume to avoid either swimming of the LED chips 25 or poor die attach if too much or too little flux is used. Flux-assisted eutectic die attach according to the present subject matter can also require the right composition for each of the flux assist material 106 and bonding metal 100 of the LED chips.

In some aspects, flux-assisted eutectic die attach according to the present subject matter can optimally utilize a very clean and flat surface and substrates that do not move or bend during heating and cooling such to stress the solder joint. Flux-assisted eutectic according to the present subject matter can utilize a fine surface roughness that is small enough not to encumber the Au/Sn bonding surface of the LED chips while being rough enough to allow flux to escape during heating. The heating profile can be matched perfectly to the bonding metal 100, such as Au or AuSn, to ensure a good weld between the bonding metal 100 and underlying conducting pad 30. Using flux-assisted eutectic for die attach according to the present subject matter also can utilize an inert atmosphere, such as a nitrogen atmosphere, to reduce oxygen gas ($O_2$) levels and also allow gravity to apply a downward force on LED chips 25. This can reduce the amount of oxidation at the metal-to-metal bond between bonding layer 100 and underlying conducting pad 30.

Still referring to FIG. 15A, a non-eutectic metal-to-metal die attach method can be used which can also comprise an assist material 106, wherein the assist material 106 can comprise a metallic material. In this aspect, bonding layer 100 can comprise a single metal or a metal alloy. For example, bonding layer 100 can comprise Au, Sn, or AuSn. In non-eutectic methods, the bonding layer does not need to reach or exceed a temperature, for example, a eutectic temperature. In this aspect, assist material 106 can comprise a metallic material to facilitate the metal-to-metal bonding. For example, assist material 106 can comprise AuSn paste or Ag epoxy. Any suitable metallic assist material 106 can be used. The metal of bonding layer 100 can attach to the metal of the assist material 106. The metal of the assist material 106 can also attach to the metal of conducting pad 30. In one aspect, a metal "sandwich" forms between bonding layer 100, assist material 106, and conducting pad 30 in non-eutectic metal-to-metal attach techniques where a metallic assist material 106 is used. Metal-assisted, non-eutectic die attach can be tedious, just as flux-assisted methods, and it is also unexpected to use such methods when attaching LED chips 25 within one or more patterns for LED devices described herein. Metal-to-metal attachment using an assist material 106 can be hard to control and tedious when attaching multiple small footprint LED chips within a device.

FIG. 15B illustrates a metal-to-metal die attach technique which does not require an assist material 106. One such method can comprise a thermal compression die attach method wherein the metal of bonding layer 100 will directly attach to the metal of conducting pad 30. The thermal compression method can be eutectic or non-eutectic. In one aspect, thermal compression can be used when bonding layer 100 comprises an alloy having a eutectic temperature. In other aspects, bonding layer 100 can comprise a metal not having a eutectic temperature. Conducting pad 30 can comprise any suitable metal, not limited to a Cu, Al, Ag, or Pt layer within a metal core printed circuit board (MCPCB). Bonding layer 100 comprises any suitable metal. In one aspect, bonding layer 100 can comprise a layer of Sn having any suitable thickness. In one aspect, bonding layer 100 can comprise a thickness greater than approximately 0 μm. In one aspect, bonding layer 100 can comprise a bonding layer equal to or greater than at least approximately 0.5 μm. In one aspect, bonding layer 100 can comprise a layer of Sn having a thickness of at least equal to or greater than approximately 2.0 μm. Unlike the flux-assisted eutectic or metal-assisted non-eutectic methods just described, thermal compression metal-to-metal die attach techniques can utilize an external downward force F as illustrated in FIG. 15B.

Force F can comprise a compression delivered in a heated environment, thus deemed a thermal compression, as opposed to dispensing a flux or metallic assist material 106. The thermal compression technique is an alternative die attach method developed to reduce metal squeeze out along the conducting pad 30 which can form Shottky or Shunt defects and allow subsequent leakage of current and other various and related problems. In one aspect, the bonding temperature in thermal compression techniques can be approximately 255° C. to 265° C. after optionally subjecting conducting pad 30 to a pre-heat treatment or process. Conducting pad 30 can be heated to a mounting temperature of at least 20° C. above the melting temperature of the bonding layer 100. The bonding time can be approximately 300 msec and the bonding force can be approximately 50+/−10 grams (g).

In some aspects, predetermined settings can be important for this method, including adequate preheat, bonding temperature, bonding time, and bonding force. The equipment and predetermined settings for use with thermal compression methods can be difficult to use and/or maintain, and it is unexpected to use such methods when attaching a large quantity of LED chips 25 in an array and/or one or more patterns. Metal-to-metal methods for attaching an array of LED chips in LED devices is not known and is unexpected to use flux-assisted eutectic, metal-assisted non-eutectic, or thermal compression die attach techniques for attaching one or more strings of LED chips 25 in an array or pattern arrangement.

Figure 16:
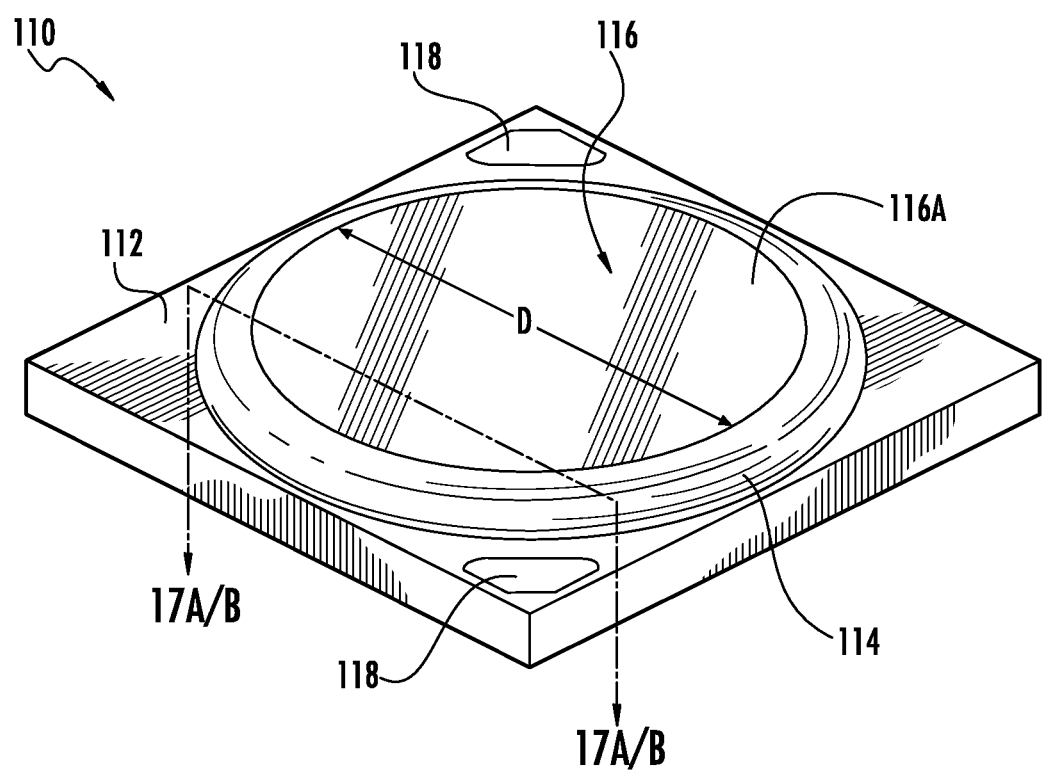
FIG. 16 illustrates a top perspective view of another embodiment of a light emitter device according to the disclosure herein.

Referring now to FIG. 16, a top perspective view of another embodiment of a light emitter device or LED device, generally designated 110, is illustrated. LED device 110 is similar in form and function to other LED devices described hereinabove. LED device 110 comprises a substrate 112, an optional retention dam or retention material 114 provided over a flat, planar surface of the substrate 112, and a light emission area, generally designated 116, provided over the planar surface of substrate 112. Electrical signal or current can pass through device 110 via passing into and out of attachment areas 118, such as solder pads. Electrical current can activate LED chips (e.g., designated "C" in FIGS. 17A to 17F) to cause emission area 116 to emit light.

Additionally, and in some aspects, LED device 110 can comprise a high density array of LED chips (e.g., C, FIGS. 17A to 17F) operable to provide a high lumen density (e.g., or a high luminous flux density) at high powers. To improve thermal management within LED device 110, emission area 116 of device 110 can comprise a protective lens, coating, and/or filling layer (e.g., 134, FIGS. 17A to 17F) over the array of LED chips (e.g., C, FIGS. 17A to 17F). The coating or layer can comprise an encapsulant or resin having a non-uniform distribution of wavelength conversion material provided therein. In some aspects, the encapsulant or resin includes a highly viscous and curable silicone resin or encapsulant.

The wavelength conversion material can comprise any suitable lumiphoric or phosphoric material, such as phosphors (e.g., designated "P" in FIGS. 17A to 17F) configured to emit yellow, green, blue, red, and/or white light upon activation or impingement with light emitted by one or more chips (e.g., C, FIGS. 17A to 17F) in the array of LED chips. Concentrating and/or or settling a greater density of the wavelength conversion material within one or more predetermined portions of emission area 116 in accordance with the disclosure herein can advantageously prevent problems with the encapsulant or resin such as cracking of the encapsulant or resin, which can be wide and/or shallow between optional retention dam 114. Other benefits include, for example, improved long term reliability (e.g., improved properties at around 1000 hours or more and 85° C., 105° C., and/or 125° C.), decreased bubbling around LED chips, a larger viewing angle, lower dCCT color spread, cooler phosphor temperatures, brighter light emission, improved sulfur resistance, and/or a smaller color point spread, including all or any combination of such features.

As LED chips (C, FIG. 17A to 17F) of device 110 generate heat, the phosphor or phosphor particles (i.e. P, FIGS. 17A to 17F) also heat up and ultimately lead to silicone or encapsulant cracking, unless the heat is quickly channeled down into the package 112, in some aspects, via settling of the phosphor over substrate 112 and LED chips C. In some aspects, phosphor (i.e. P, FIGS. 17A to 17F) can be the hottest part of the LED package 110.

Substrate 112 of LED device 110 can comprise any suitable low thermal resistance material(s). Substrate 112 can comprise any suitable mounting substrate, for example, a PCB, a MCPCB, FR-4, external circuitry, flexible circuitry, a laminate substrate, and/or any other suitable substrate over which light emitter devices such as LED chips or LEDs may mount and/or attach. In one aspect and for example only without limitation, substrate 112 can comprise a footprint or overall length and width of approximately 13 mm×13 mm or more, approximately 16 mm×16 mm or more, approximately 18 mm×18 mm or more, approximately 24 mm×24 mm or more, approximately 27 mm×27 mm or more, approximately 35×35 mm or more, or more than 35 mm per side. In other aspects, substrate 112 can comprise any suitable dimension and/or shape, for example, a circular or rectangular shape.

In some aspects, an optional retention material 114 is provided. Retention material 114 can comprise a raised barrier about one or more LED chips disposed within emission area 116. The raised barrier can comprise a dispensed dam, a planed structure, walled structure, a wall, etc., about emission area 116. For example, emission area 116 can comprise an encapsulant or filling material that can be retained via surface tension, raised bumps, or trenches of substrate 112, thereby obviating the need for retention material 114. Where present, retention material 114 can comprise a dispensed or injectable material for providing any size, shape, and/or location of emission area 116 over substrate 112. Emission area 116 can be centered over substrate 112 or non-centered over substrate 112. More than one emission area 116 can be provided per substrate 112.

In some aspects, emission area 116 can comprise a light emitting surface (LES) 116A comprising a diameter D. Diameter D of LES 116A can measure approximately 6 mm or more, approximately 9 mm or more, approximately 12 mm or more, approximately 14 mm or more, approximately 19 mm or more, approximately 23 mm or more, approximately 30 mm or more, or more than approximately 35 mm. Device 110 can comprise a substantially flat, planar substrate 112 allowing for larger lenses and/or emission areas 116 to be provided thereon. Thus, brighter parts having higher lumen densities of approximately 30 $lm/mm^2$ or more can be emitted from device 110 via LES 116A.

Notably, emission area 116 comprises a closely packed or high density array comprised of multiple LED chips (e.g. C, FIGS. 17A to 17F) provided below a lens, resin (e.g., curable), viscous liquid (e.g., curable), protective layer, and/or encapsulant. Emission area 116 comprises a chip-on-board (COB) array of LED chips operable to deliver a high luminous flux density via LES 116A. The lumen density comprises approximately 30 $lm/mm^2$ or more, approximately 60 $lm/mm^2$ or more, approximately 90 $lm/mm^2$ or more, approximately 100 $lm/mm^2$ or more, or more than approximately 180 $lm/mm^2$. In some aspects, the lumen density of a device such as device 110 is determined by dividing the lumens output (e.g., a total or maximum luminous flux and/or a lumen range) via device 110 by the area of LES 116A as determinable from diameter D.

FIGS. 17A to 17F illustrate various sectional and/or detailed views of device 110. Substrate 112 can comprise one or more layers of material, similar to substrate 12 described hereinabove (e.g., see FIG. 7). Substrate 112 can comprise a substantially planar surface over which multiple LED chips C can be mounted or otherwise arranged. In some aspects, LED chips C form a tightly packed array of chips C that can be arranged in linear arrangements, non-linear arrangements, and/or one or more patterned arrangements (e.g., having a same and/or multiple different patterns) as described hereinabove. LED chips C can comprise a COB array of horizontal and/or vertically structured chips, which may or may not include wirebonds or other electrical connectors. In some aspects, LED chips C comprise horizontally structured chips having an anode and a cathode (e.g., in the form of bond pads) disposed on a top surface of the LED chip C thereby allowing the chips to be serially connected to each other and traces via wirebonds 132 (e.g., see FIG. 17A). In other aspects, LED chips C can comprise chips that are directly attached, where an anode and a cathode (e.g., in the form of bond pads) are on a bottom surface of the LED chip C thereby obviating the need for wirebonds (e.g., see FIG. 17B) or other electrical connectors. Rather, LED chips C having bond pads on a bottom surface can directly attach to and receive current from an electrically conductive mounting pad or floor 124.

Substrate 112 can comprise, for example, a core layer 118, a dielectric layer 128, an electrically conductive mounting pad or light emission floor 124, first and second conductive traces 122 and 126, and a reflective solder mask material 128 at least partially disposed between light emission floor 124 and each of conductive traces 122 and/or 126. Light emission floor 124 and/or traces 122 and 126 can, for example, comprise Cu (e.g., or a Cu-alloy), either alone or in combination with Ti, Au, Pt, and/or Ag. In other aspects, substrate 112 comprises a core layer of material having FR-4 and/or flexible circuitry (e.g., traces) adhered thereto. Solder mask material 128 can extend over substrate 112 to outermost edges thereof. Any suitable substrate 112 can be provided, and is contemplated herein.

As FIGS. 17A to 17F illustrate, a filling material generally designated 134 can be selectively filled to any level higher, lower, or equal to the height of the optional retention material 114. Filling material 134 can comprise a planar surface, a convex surface, a concave surface, and/or combinations thereof. Filling material 134 can comprise a layer of material that is dispensable and curable, such as an encapsulant or resin. Notably, filling layer 134 can comprise a coating or layer of silicone encapsulant or resin having a non-uniform distribution of wavelength conversion material provided therein.

In some aspects, the wavelength conversion material can comprise one or more phosphors P that are settled and/or more highly concentrated within one or more predetermined portions of filling material 134 for providing a thermal barrier between heat generating LED chips C and portions of filling material 134 that are devoid and/or less concentrated with phosphors P. The higher density areas of settled phosphor P in accordance with the disclosure herein are cooler during operation by causing heat to more readily escape or route through substrate 112.

In some aspects, filling material 134 alone, such as silicone encapsulant, can be subject to severe thermal loads and/or thermal degradation over time. For example, filling material 134 can comprise a wide and shallow silicone encapsulant "puck" that can be susceptible to localized heating and cracking via heat generated at LED chips C and heat generated by the florescence (e.g., phosphoric) centers dispersed in the encapsulate filling material 134. Settling wavelength conversion material such as phosphor P close to the LED chips C and/or substrate 112 (e.g., light emission floor 124) provides a barrier promoting an improved heat transfer route into the heat-sinking substrate 112 and thereby alleviating encapsulant overload due to thermal stress. This can advantageously prevent catastrophic damage of device 100 and prolong the useful operating life of device 110. Other benefits of settled wavelength conversion material (e.g., phosphor, P) include, for example, improved far field images (e.g., thereby promoting a very uniform color appearance in the far field with a larger viewing angle), lower color shifts (lower dCCT), improved long term reliability (e.g., improved brightness maintenance (optics) at approximately 1000 hours or more), higher product ratings, cooler phosphor operating temperatures, and/or a lower color point spread, including all or any combination of such features.

Figure 17A:
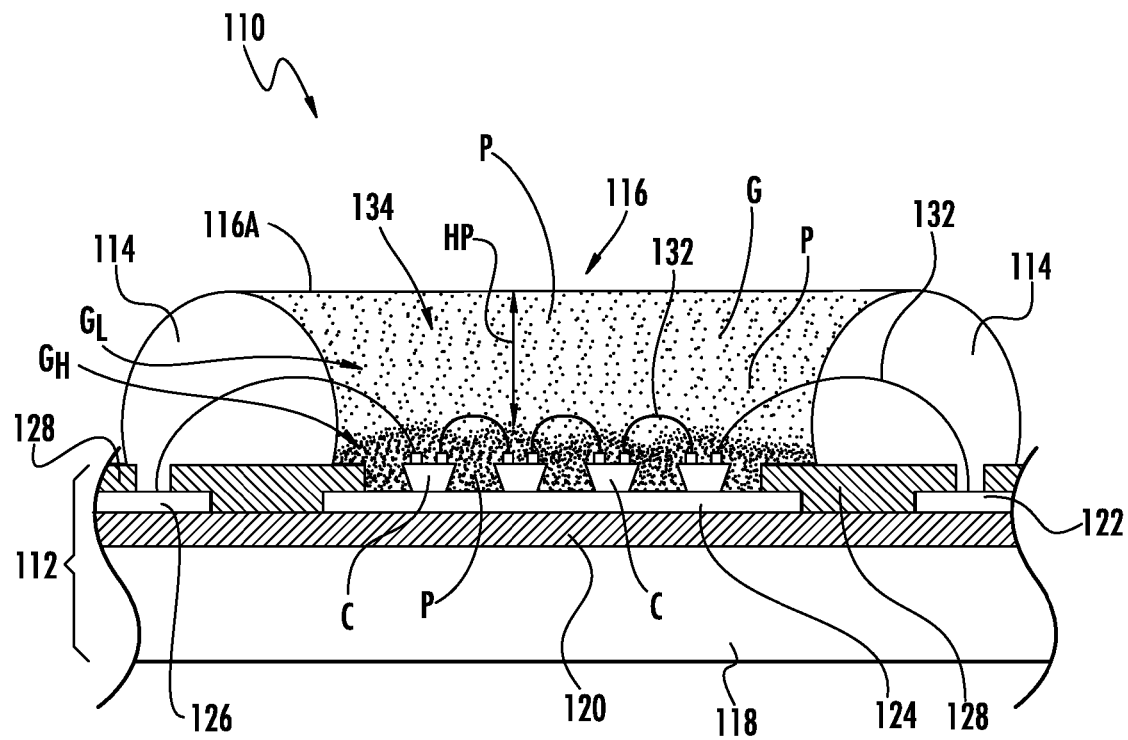
FIGS. 17A to 17F illustrate various sectional views of a light emitter device according to the disclosure herein.

As FIG. 17A illustrates, wavelength conversion material such as one or more phosphors P can be selectively added in any desired amount or quantity to filling material 134. Notably, filling material 134 comprises a non-uniform suspension of phosphor P particles in the bulk of the encapsulant filling material 134. Phosphor P is settled, concentrated, and/or more densely packed towards a bottom of the encapsulant filling material 134 between and/or over the LED chips C. Settling of the phosphor P is achieved via any suitable method including, for example, gravity sedimentation, centrifuge, addition of a solvent, and/or vibration, including for example as described in U.S. Pat. No. 8,410,679 to Ibbetson et al., and U.S. Pat. No. 8,425,271 to Hussell et al., the disclosures of which are each hereby incorporated by reference herein in their entireties. Other possible settling methods comprise engineering the phosphor particle(s) size(s) to promote settling and adjusting the fluorescent (e.g., phosphoric) powder flow characteristics (e.g., clumpiness, flow rate, compaction, temperature, humidity, electro-static charge, aeration, storage time, etc.). Phosphor settling may be caused and/or accelerated by reducing the viscosity of filling material 134 via heating to intermediate temperatures. As filling material 134 is heated, it becomes less viscous causing phosphor P particles to settle more quickly towards a bottom of the filling material 134, for example, proximate light emission floor 124 and/or over chips C.

Phosphor P can comprise one or more of a wide variety of wavelength conversion materials including luminescent materials. Examples of luminescent materials (lumiphors) include phosphors, Cerium-doped Yttrium Aluminum Garnet (YAG), Nitrides, Oxy-Nitrides, scintillators, day glow tapes, nanophosphors, quantum dots (e.g., such as provided by NNCrystal US Corp. (Fayetteville, Ark.), and inks that glow in the visible spectrum upon illumination with (e.g., ultraviolet) light. Inclusion of lumiphors in LED chips has been accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

In some aspects, device 110 can comprise one or more blue LED chips and/or a cyan LED chip in combination with a lumiphoric material containing layers that include first, second and third phosphors P therein. A first phosphor may down-convert light received from the blue LED chip to light having a peak wavelength in the green color range. This phosphor may have a sufficiently broad full width half maximum (FWHM) bandwidth such that its FWHM emission spectra falls into at least part of the cyan color range. In some embodiments, this first phosphor may comprise a LuAG:Ce phosphor (i.e., cerium doped LuAG). LuAG:Ce phosphors may have a peak emission wavelength of between 535 and 545 nanometers, and a FWHM bandwidth of between about 110-115 nanometers. As such, the FWHM bandwidth of LuAG:Ce phosphors may extend throughout the entire cyan color range. A second phosphor may down-convert light received from the blue LED chip and/or cyan LED chip to light having a peak wavelength in the yellow color range. In some embodiments, this second phosphor may comprise a YAG:Ce phosphor. A third phosphor may down-convert light received from the blue LED and/or cyan LED chip to light having a peak wavelength in the red color range. In some embodiments, this third phosphor may comprise a $(Ca_{1-x}SR_x)SiAlN_3:Eu^{2+}$ phosphor.

In some aspects, a LuAG:Ce phosphor and a YAG:Ce could be grown together in a single cerium-doped structure (e.g., layer) that includes lutetium, yttrium, aluminum and oxygen. For example, the LuAG:Ce phosphor and the YAG:Ce could be implemented together as a $Lu_{1-x}Y_xAl_5O_{12}$:Ce material. Such a material would act as both a first phosphor that emits light like a LuAG:Ce phosphor and a second phosphor that emits light like a YAG:Ce phosphor (which would provide a combined spectrum having a peak between the peak wavelength of the LuAG:Ce phosphor and the peak wavelength of the YAG:Ce phosphor). Thus, it will be appreciated that the first and second phosphors may comprise two separate phosphors, two separate phosphors that are mixed together, and/or a composition in which both phosphors are grown together in the same structure.

Phosphor P can be applied to or over the LED chips C according to various techniques including, but not limited to, spraying, screen printing, evaporation (sputter, e-beam, thermal, CVD, electrostatic and/or electrophoeric deposition), dipping, spin coating or direct dispensing over the die within a dammed/bounded area within retention material 114 and/or other techniques. The thickness of phosphor P over LED chip C can, for example, range between approximately 2 µm and approximately 100 µp, however, any thickness of phosphor P can be provided. The thickness that is used may be selected to reduce or minimize self-absorption and/or scattering and may depend on the coating process, the density of the phosphor and/or the desired application.

Settling or concentrating phosphor P in a predetermined portion of filling material 134 (e.g., towards the bottom or bottom portion of filling material 134) can alleviate failure of device 110 due to thermal stress or cracking of the filling material 134, as such problems can occur in devices having uniform dispersions or suspensions of phosphor in a filling material. Localized heat generated from LED chips is known to cause cracking in filling material having a uniform suspension or dispersion of phosphor therein. Notably and as FIG. 17A illustrates, filing material 134 has a non-uniform suspension of phosphor P provided therein.

After phosphor P settles or more densely occupies one or more portions of filling material 134, the filling material 134 can be cured thereby fixing the phosphor P in place. Notably, phosphor P forms a thermal barrier over LED chips, which causes heat generated thereby to dissipate more readily into substrate 112. As a result of the phosphor P running cooler, LED device 110 runs cooler, LED chips C run brighter, and optical properties (e.g., higher luminous flux, improved color rendering, decreased color shifting, etc.) of device 110 also improve. As noted herein, a lumen density or luminous flux density emitted from LES 116A of device 110 can increase to approximately 30 lm/mm$^2$ or more as thermal management improves within device 110 via settling or concentrating phosphor P to predefined portions of device 110. LED chips C, filling material 134, and wavelength conversion material, for example, phosphor P can each be provided at or below LES 116A.

Figure 17B:
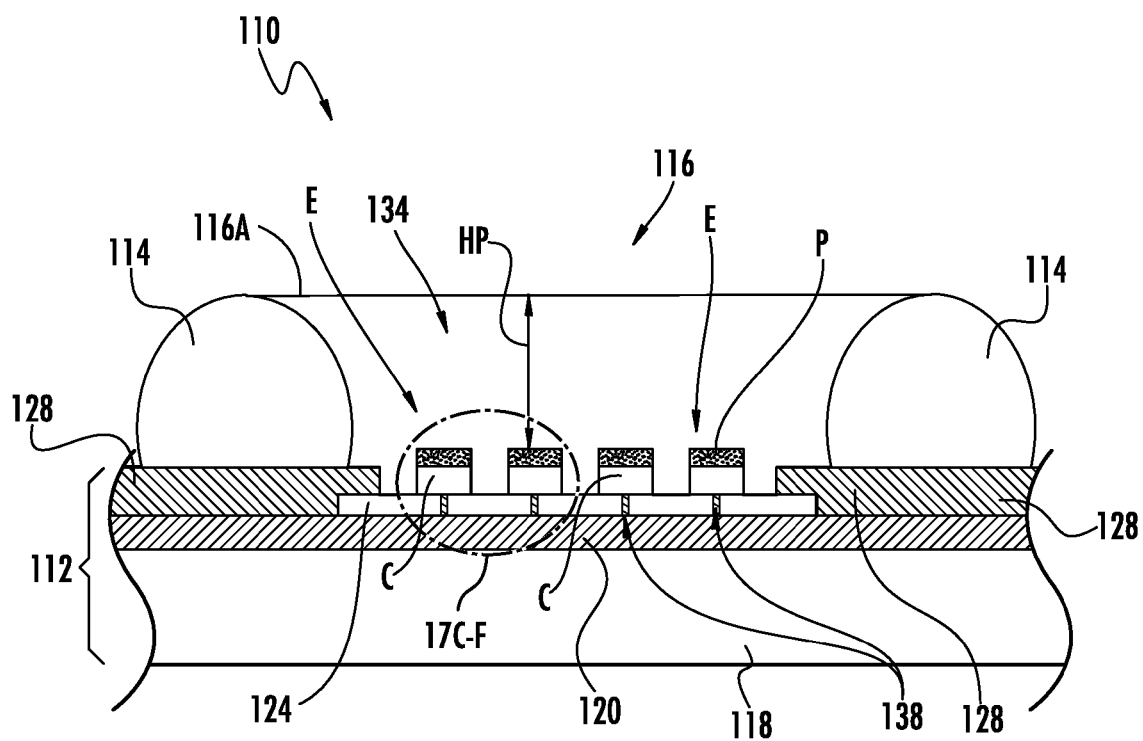

Referring generally to FIGS. 17A and 17B, substrate 112 can, for example, have a thickness or height of approximately 1 mm. Filling material 134 can, for example, have an overall height or thickness of approximately 0.6 mm. Settling or otherwise concentrating an amount of phosphor P towards emission floor 124 and over chips provides a layer of phosphor P that is, for example, approximately 0.25 mm or more, depending upon the LED chips C. Filling material 134 thus can be relatively shallow compared to the diameter D (FIG. 16) of LES 116A, which as described above which can vary from between approximately 6 mm to more than 35 mm. A height HP at or above a surface of the settled phosphor P to an upper surface of the filling material 134 (i.e., to LES 116A) is approximately 80 µm (i.e., 0.08 mm).

In FIG. 17A, device 110 comprises a non-uniform gradient, generally designated G, of phosphor P particles suspended or dispersed within filling material 134. A gradient G of phosphor P particles comprises a lower gradient $G_L$ region, where phosphor particles P are provided in a lower concentration or density, and a higher gradient region $G_H$, where phosphor particles are provided in a higher concentration within filling material 134. The concentration or gradient G of phosphor P particles within filling material 134 increases as the filling material 134 becomes to closer to floor 124 of substrate 112. Phosphor P particles may disperse, distribute, clump or settle at the bottom of the filling material "puck" 134 for preventing excessive local heating and cracking of filling material 134.

FIG. 17B illustrates another embodiment of LED device 110, where emission area 116 comprises horizontally structured light emitters E that are devoid of wirebonds 132 (e.g., FIG. 17A). Light emitters E can comprise an LED chip C having a layer of phosphor P disposed over the LED chip C. In some aspects, the phosphor coating P is formed over LED chip C during fabrication thereof. In some aspects, phosphor P is only provided over at least one surface of each LED chip C. In other aspects, phosphor P is provided over two or more surfaces of each LED chip C (e.g., FIG. 17D). LED chips C can be directly attached to electrically conductive emission floor 124 of substrate 112. Emission floor 124 can be provided over an optional dielectric layer 120 and core material 118. Dielectric layer 120 and/or core layer 118 can, for example, comprise FR-4 where emission floor 124 is attached thereto via a sticker or adhesive.

Mounting pad 124 of substrate 112 can comprise one or more electrically insulating or separating portions 138 comprised of electrically insulating material. Separating portions 138 allow electrical signal to flow across separate terminals or bond pads disposed on a bottom surface of each LED chip C. That is, in one aspect LED chips C can comprise horizontally structured chips having both the anode and cathode bond pads directly attached to emission floor 124. Separating portions 138 provide a barrier between the anode and cathode bond pads of LED chips C, such that electric current can flow into and out of the chips C via the bond pads, thereby illuminating the chips C. LED chips C can be electrically connected only in parallel, only in series, or in an arrangement comprising a combination of parallel and series.

Notably, concentrating or confining phosphor P only over LED chips C can provide a thermal barrier between the heat generating LED chips C and the remainder of filling material 134 (e.g., that is devoid of phosphor P). This can advantageously provide improved thermal management within device 110 as heat becomes more efficiently routed to heat-sinking substrate 112 thereby allowing phosphor P to run cooler during operation. As phosphor P runs cooler, flux density increases, luminous flux emitted from LES 116A increases, color rendering increases, and/or sulfur resistance improves, including all or any combination of such features. Methods for fabricating light emitters E comprised of LED chips C having a planarized coating of phosphor P integrated therewith are discussed by way of example in U.S. Patent Application Publication No. 2008/0179611 to Chitnis et al., the disclosure of which is hereby incorporated by reference herein in the entirety.

FIGS. 17C to 17F illustrate detail views of other embodiments of LED chips C and phosphor P which may be used in device 110 in place of the emitters E illustrated in FIG. 17B.

Figure 17C:
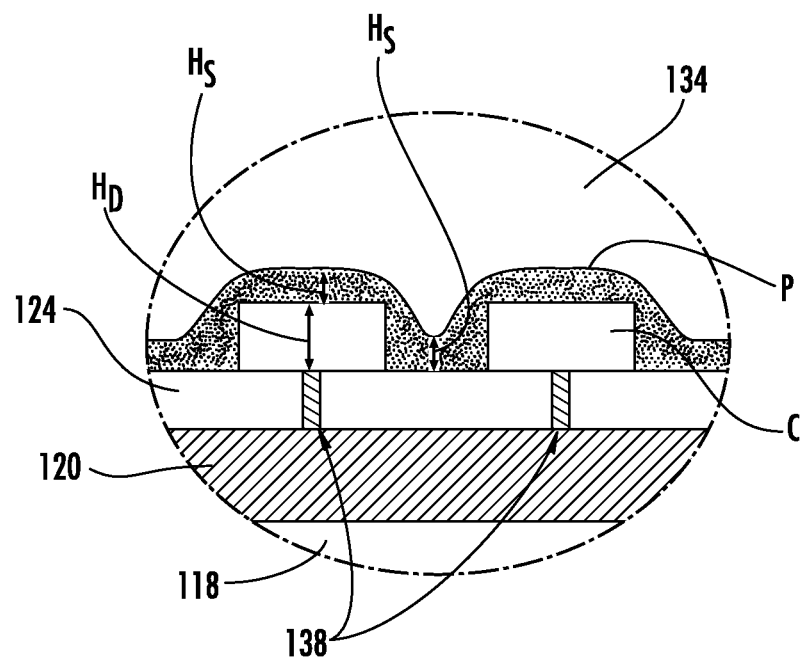

Referring to FIG. 17C, a layer of phosphor P can generally settle or otherwise be provided proximate a bottom of filling material 134 and generally conform to the shape of LED chips C in a conformal layer that can, for example, have an at least substantially uniform thickness. In some aspects, phosphor P is sprayed over LED chips C prior to addition of a silicone filling material 134. A sprayed and/or settled layer of phosphor can, for example, comprise a uniform thickness or height $H_S$ of approximately 100 µm (i.e., 0.1 mm) or more over each LED chip C. LED chips C can comprise any suitable chip size, shape, and/or thickness. In some aspects, the thickness or height $H_S$ of LED chip C is approximately 0.25 mm or more, 0.3 mm or more, 0.4 mm or more, or 0.5 mm or more.

In other aspects, and instead of being sprayed, phosphor P can be caused to settle or concentrate within a conformal layer over LED chips C, and within a predetermined bottom-most portion of filling material 134 for improving thermal management and sulfur resistance within LED device 110.

Figure 17D:
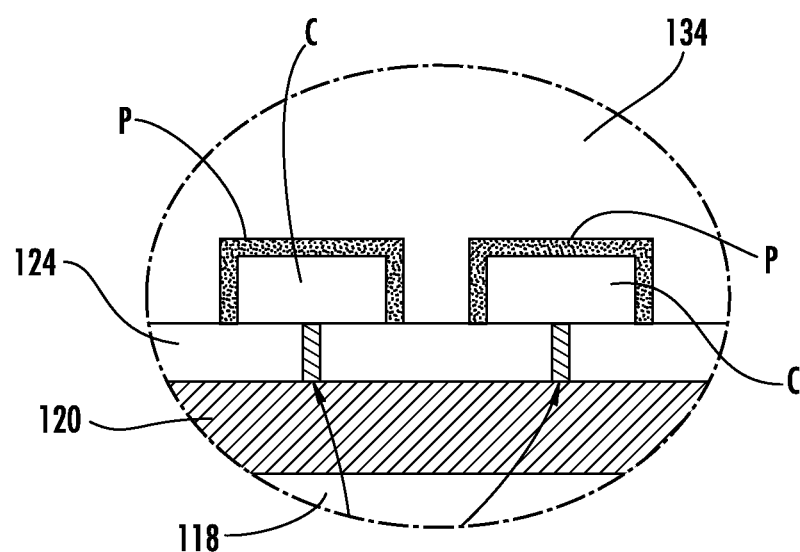

Referring to FIG. 17D and in some aspects, phosphor P can be provided over more than one surface of each LED chip C. In some aspects, phosphor P is provided over each surface of LED chip C. Phosphor P can be provided to LED chips C prior to addition of a silicone filling material 134, thereby obviating the need for causing phosphor to settle and/or accumulate proximate a floor 124 of substrate 112. Thus, in some aspects, a phosphor P layer is visibly separate from a layer of filling material 134 that is devoid of phosphor. In other aspects, filling material 134 includes a variable and visibly distinct gradient (e.g., G, FIG. 17A) of phosphor P provided therein.

Figure 17E:
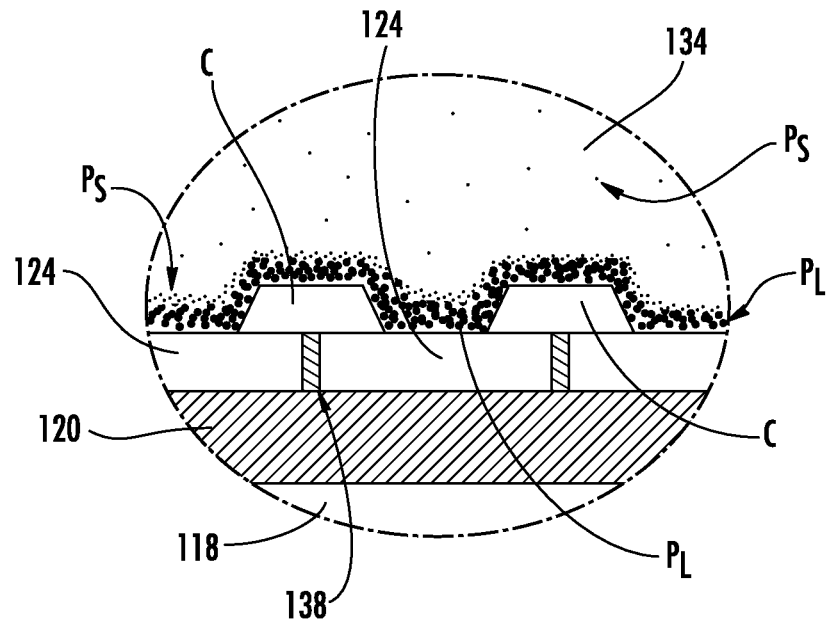

As FIG. 17E illustrates, more than one type, amount, and/or size of phosphor P can be provided within a LED device 110. In some aspects, larger phosphor particles $P_L$ can be used in addition to smaller phosphor particles $P_S$. In some aspects, the large and small phosphor particles $P_L$ and $P_S$, respectively, can be adapted to emit different wavelengths of light upon impingement of light from LED chips C. For example, $P_L$ can be configured to emit a first color of light and $P_S$ can be configured to emit a second, different color of light. In some aspects, only one type or color of phosphor P is provided in filling material 134. That is, $P_L$ can be configured to emit a first color of light and $P_S$ can also be configured to emit the same color of light, however, the phosphor particles can differ in size. That is, in some aspects, both $P_L$ and $P_S$ can comprise a same color (e.g., yellow, red, green, blue, etc.) of phosphor P but vary by size or diameter. In other aspects, at least two different types (e.g., material composition) and/or colors of phosphor P are provided in filling material 134. Providing three or more different types or colors of phosphor P is also contemplated. The type(s) and amount(s) of phosphor P can vary based upon the desired color point of device 110. Phosphor particles $P_L$ and $P_S$ may be provided in separate portions and/or intermixed portions in some aspects. Devices 110 can comprise phosphor P configured to emit light that is red, green, yellow, blue, white, and/or combinations thereof depending on a desired color point.

In some aspects, device 110 is operable to produce a warm white (WW) color point of light that is at least 2700K, nominally 3000K, and up to 5000K CCTs, with 70-, 80-, and 90-CRI and above options. Cool white (CW) options are also contemplated herein.

As FIG. 17E illustrates, phosphor can be caused to settle or accumulate in one or more predetermined portions of filing material 134. In some aspects, larger phosphor particles $P_L$ can settle closest to the emission floor 124 surface of substrate 112. Smaller phosphor particles $P_S$ can settle over larger phosphor particles $P_L$ and further away from floor 124. Thus, in some aspects multiple layers of differently sized, shaped, and/or colors of phosphor P are provided a bottom portion of filling material 134 such that filling material is non-uniform. The layers of large and small phosphor particles $P_L$ and $P_S$, respectively, can run cooler and prevent cracking of filling material 134 and improve heat dissipation within device 110. Resistance to sulfur degradation, color rendering, luminous flux, luminous flux density, color spread, and far field patterns can also be improved.

In some aspects, filling material 134 is intermixed with phosphor particles in each of the layers of smaller phosphor particles $P_S$ and larger phosphor particles $P_L$. In some aspects, filling material 134 comprises multiple layers over LED chips, one of which can be predominantly a first type of phosphor (e.g., $P_L$) and encapsulant and a second layer which can be predominantly a second type of phosphor (e.g., $P_S$) and encapsulant. Phosphor particles $P_L$ and $P_L$ can comprise phosphor materials for converting light emitted by at least one LED chip of the array of LED chips to a peak wavelength in a red color, a yellow color, a green color, a blue color, a white color, or combinations thereof. In some aspects, a first layer of encapsulant and a predominantly red phosphor can be provided adjacent a second layer of encapsulant and a predominantly yellow phosphor. Dominant layers of phosphor particles of more than two types, colors, materials, sizes, and/or shapes can be provided.

In some aspects, not all of the phosphor P particles settle. As FIG. 17E illustrates, portions of filling material 134 may not be totally clear or devoid of phosphor, but instead still have some small particles of phosphor $P_S$ suspended therein. This can be desirable for maintaining a uniform color point and/or truer color rendering. In this example, most or a predominate portion of the small particles of phosphor $P_S$ have settled and are in the lower portion or layer of encapsulant 134 with the large particles of phosphor $P_L$, but there are still some unsettled small particles of phosphor $P_S$ in the upper layer or portion of encapsulant 134. The unsettled small particles of phosphor $P_S$ result in encapsulant 134 having a mix of at least two types of phosphor where at least one type of phosphor is predominantly in one layer or portion and another type of phosphor is predominantly in the at least one other layer or portion.

Figure 17F:
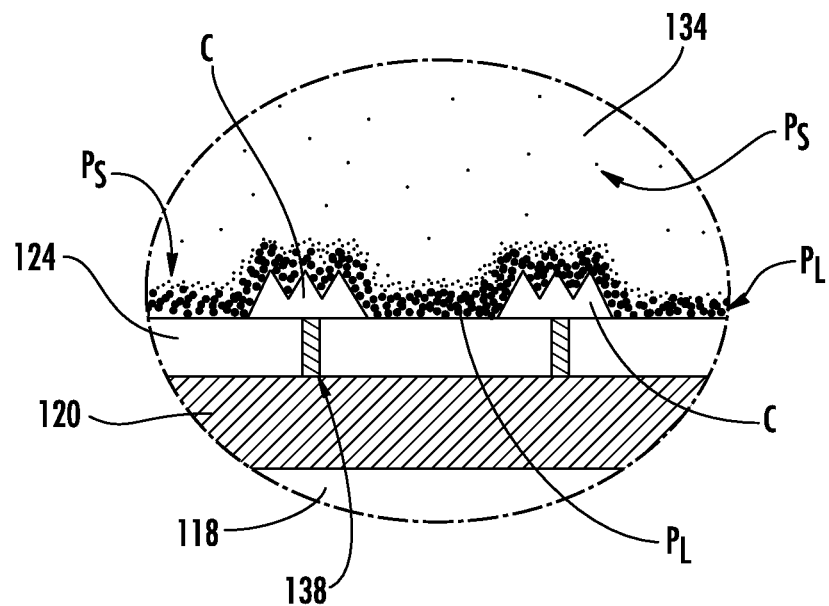

As FIG. 17F illustrates, more than one type of phosphor P and/or non-planar LED chips C can be provided within a LED device 110. As FIG. 17F illustrates, LED chips C can comprise a non-planar upper surface. Notably, one or more layers or portions of encapsulant comprising phosphor P can be caused to settle and/or accumulate over each LED chip C thereby conforming to the non-planar upper surface of LED chips C. Each layer or portion of encapsulant can comprise different amounts, particles sizes, and/or colors or types of phosphor. Different layers of encapsulant and predominantly red, green, yellow, blue, and/or white phosphors can be provided over each chip C.

In some aspects, only one layer or portion of encapsulant having settled phosphor P is provided over each LED chip C. In other aspects, two layers or portions of encapsulant having settled phosphor P are provided over each LED chip C. For example, filling material 134 can comprise encapsulant having a first portion of encapsulant and a second portion of encapsulant. The first portion of encapsulant can comprise both small phosphor particles $P_S$ and large phosphor particles $P_L$, although the first portion can be predominantly comprised of large phosphor particles $P_L$. The second portion of encapsulant can also comprise both small phosphor particles $P_S$ and large phosphor particles $P_L$, although the second portion can be predominantly comprised of small phosphor particles $P_S$. In other aspects however, the second encapsulant portion can comprise a layer in which the large phosphor particles $P_L$ have substantially completely settled. Thus, the second portion of encapsulant comprises small particles $P_S$ and is otherwise devoid of the first wavelength conversion material, or large phosphor particles $P_L$ (e.g., as in the upper portion of the filling material 134 as illustrated in 17F, and also moving towards LES 116A in FIG. 17A).

In some aspects, large and small phosphor particles $P_L$ and $P_S$, respectively, can only vary in particle size (e.g., diameter) but can be otherwise comprise a same shape, surface texture, coating, wear or attrition characteristic, propensity to electrostatic charge, hardness, stiffness, strength, fracture toughness, and/or color. In other aspects, large and small phosphor particles $P_L$ and $P_S$, respectively, not only vary in particle size (e.g., diameter) but can also vary according to shape, surface texture, coating, wear or attrition characteristic, propensity to electro-static charge, hardness, stiffness, strength, fracture toughness, and/or color.

Figure 18:
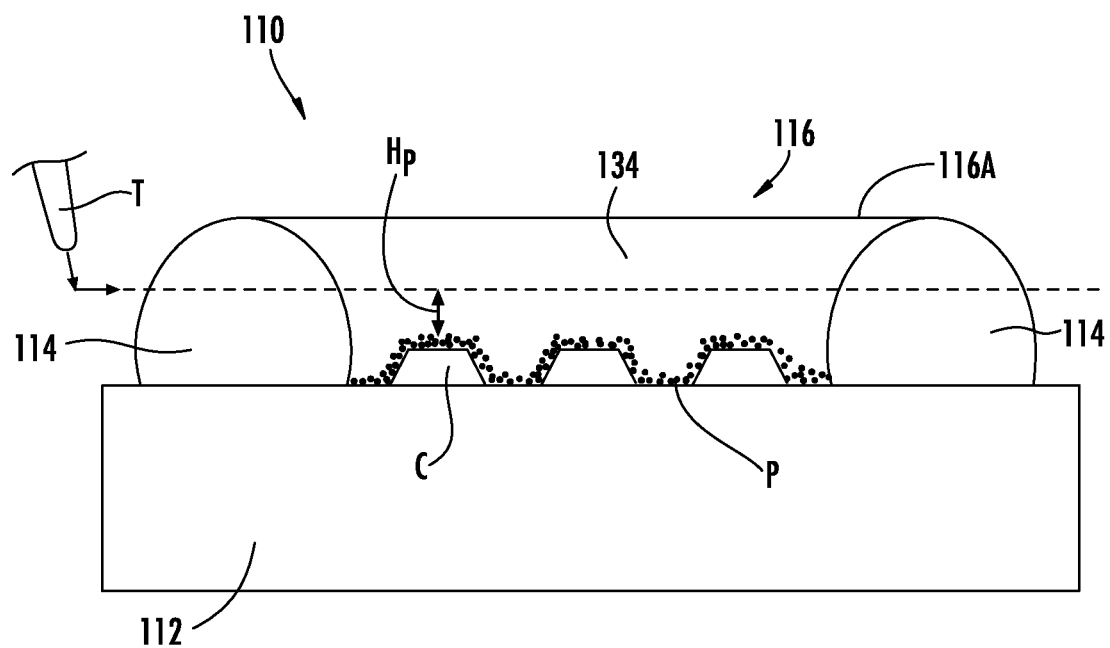
FIG. 18 emitter a sectional view of associated with method of providing light emitter devices according to the disclosure herein.

FIG. 18 illustrates one method of providing LED device 110 having a non-uniform dispersion or suspension of phosphor P described herein. As FIG. 18 illustrates, a high density array of closely packed LED chips C can be provided over a planar surface (e.g., emission floor 124) of substrate 112. An optional retention material 114 can be provided about the chips. Emission area 116 comprises LED chips C and non-uniform filling material 134. A high luminous flux density of light (e.g., 30 lm/mm$^2$ or more) is emitted from LES 116A upon illumination of LED chips C. Settling phosphor P proximate the bottom of filling material 134 improves long term reliability at high luminous flux densities.

In some aspects, filling material 134 containing a predetermined amount of one or more types of phosphor P is provided over substrate 112. The phosphor P particles can be settled at a higher concentration within a portion of filling material 134, such as proximate floor of substrate 112 for improving heat dissipation through the substrate 112. Phosphor P can form a conformal layer over LED chips C upon settling. In some aspects, a tool T can be applied to device 110 for removing and/or planing material as indicated along the broken line for forming a smooth surface. In some aspects, portions of retention material 114 and/or filling material 134 are each reduced to substantially a same height, such that the amount of material between the phosphor $H_P$ layer and LES 116A is approximately 80 μm. Tool T can remove a portion of filling material 134 prior to or after filling layer 134 is cured.

In some aspects, tool T removes only silicone encapsulant (e.g., clear filling material 134) that is devoid of phosphor P. In some aspects, the entire clear region of filling material 134 can be removed. In further aspects, a small amount of residual phosphor P that may not settle within filling material 134, thus, a limited amount of phosphor P may also be removed via tool T.

Figure 19:
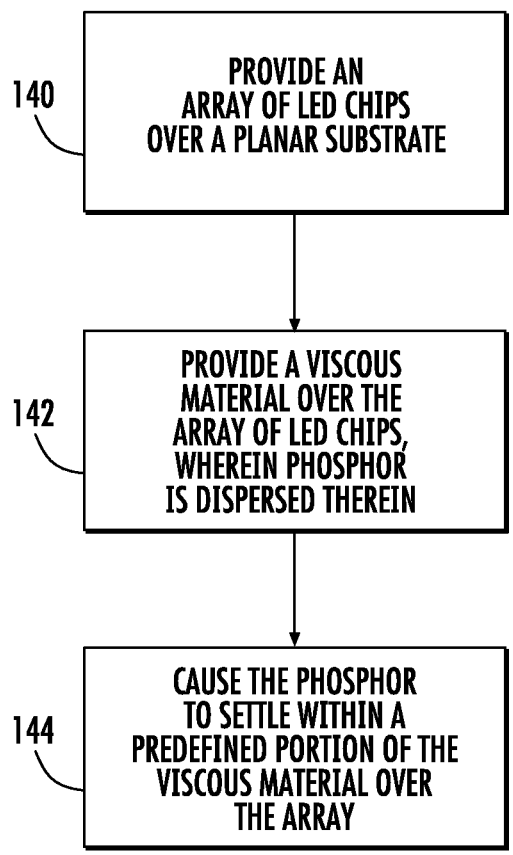
FIG. 19 illustrates a flow chart associated with a method of providing light emitter devices according to the disclosure herein.

FIG. 19 illustrates a method of providing LED devices described herein. In block 140, an array of LED chips is provided over a planar substrate and/or a planar emission floor of the substrate. The substrate comprises a high thermal resistance substrate with a substantially flat, planer surface. The LED chips can be electrically connected in parallel, series, or combinations thereof via wired or wireless connections. One or more different patterns of LEDs can be provided over substrate. In some aspects, a high density array of LED chips is provided over substrate, such that a total area occupied by the array of LED chips is approximately 25% or more of the area of the emission floor. In some aspects, the array of LED chips occupies approximately 35% or 45% or more of the area of the emission floor. In further aspects, the array of LED chips occupies approximately 50% or more of the area of the emission floor. LED chips occupying more than approximately 50% (e.g., 60%, 75%, etc.) of the area of the emission floor are also contemplated. In some aspects, a chip spacing between two adjacent LED chips in the array of LED chips is approximately 50 μm or more, approximately 200 μm or more, approximately 300 μm or more, approximately 400 μm or more, approximately 500 μm or more, or more than 500 μm.

In block 142, a viscous material is provided over the LED chips, and phosphor is dispersed therein. In some aspects, filling material (134, FIGS. 17A to 17F) comprises a viscous material such as silicone encapsulant or resin. The viscous filling material can harden or cure thereby forming a protective layer over the array of LED chips. One or more different types of wavelength conversion materials or phosphor can be dispersed within the viscous filling material.

In block 144, the phosphor is caused to settle within a predefined portion of the viscous material over the array of LED chips. As described in FIGS. 17A to 17F, phosphor P can be provided proximate a bottom most portion of filling material 134 and over an emission floor 124 thereby conforming to a profile shape of the LED chips C. In other aspects, phosphor can be confined to a predefined portion of filling material by spraying phosphor over LED chips prior to dispensing filling material, and/or manufacturing LED chips with phosphor coatings applied during wafer fabrication. That is, the phosphor can only be provided over the LED chips. In some aspects, filling material can be increased in temperature thereby decreasing the viscosity thereof. As the viscosity decreases, the phosphor particles (P, FIGS. 17A to 17F) distill faster to the bottom of the filling material (134, FIGS. 17A to 17F) and accumulate in a more dense concentration over the LED chips.

In some aspects, causing the phosphor to settle includes settling various sizes of phosphor particles over substrate and/or LED chips. Larger phosphor particles may easily descend towards a floor of the substrate, and smaller ones may accumulate over the larger particles while also still remaining suspended within the viscous material. In some aspects, a visible gradient of phosphor is observed within the viscous material. Notably, a higher density of phosphor particles is disposed proximate the bottom of the viscous material (e.g., away from LES 116A, FIG. 17A).

In some aspects, causing the phosphor to settle is achieved using any suitable method including gravity sedimentation, centrifuge, addition of a solvent, changing the viscosity of the viscous material via heating and/or cooling, and/or vibration.

Figure 20:
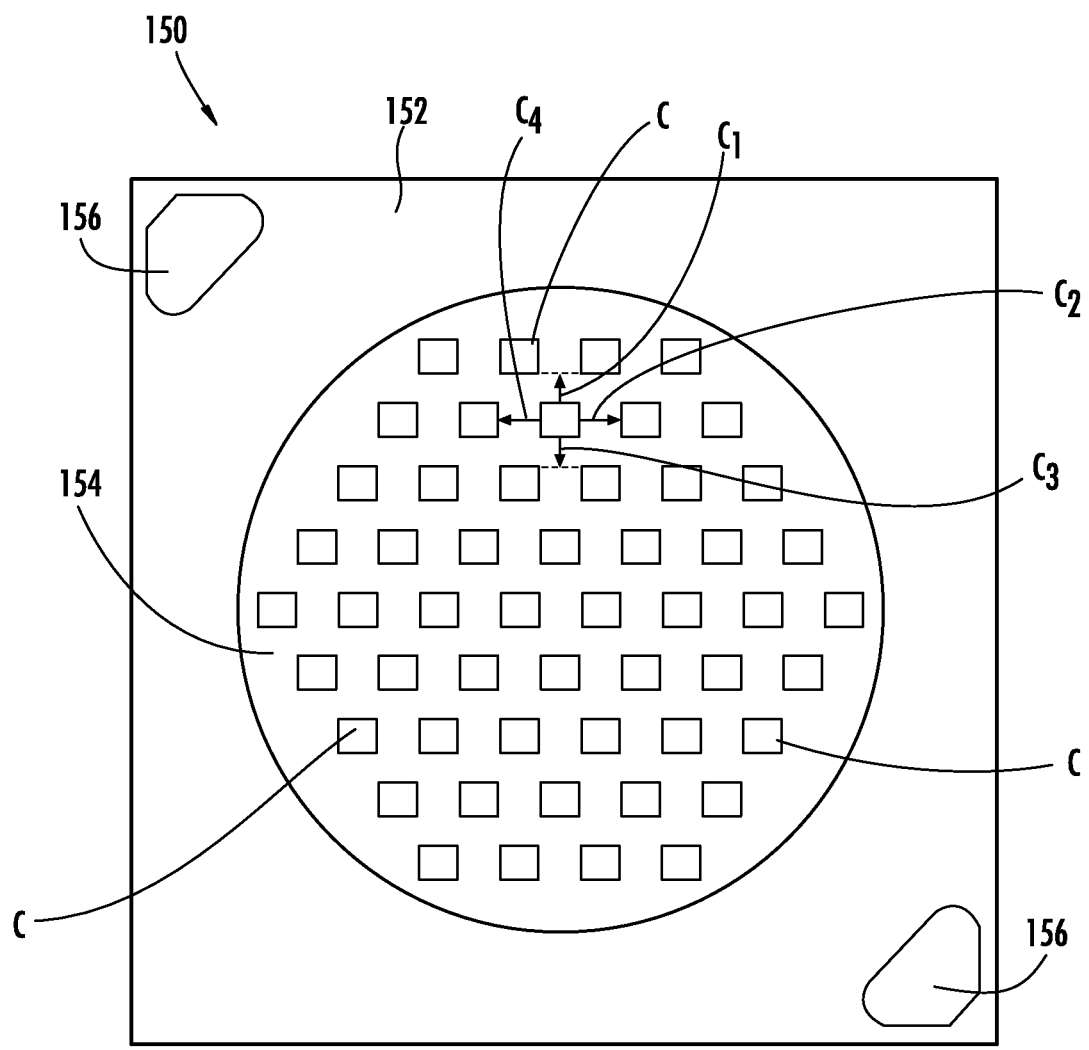
FIG. 20 illustrates a top view of a light emitter device according to the disclosure herein.

FIG. 20 is a light emitter device or LED device, generally designated 150, which for illustration purposes is devoid of filling material and/or a retention dam. LED device 150 comprises a substrate 152, a floor 154 of an emission area (e.g., 116, FIG. 16) that is substantially flat, and attachment areas 156 for supplying electrical current or power to device 150. Device 150 is similar in form and/or function to previously described devices, and illustrates an example of chip spacing within devices described herein.

A plurality of LEDs, or LED chips C can be provided in an array over floor 154 of emission area. LED chips C can comprise any suitable size, shape, thickness, build, and/or structure. LED chips C can be directly attached to or flip chip bonded to floor 154. LED chips C can have a rectangular, squared, or any other suitable shape. Lateral sides of LED chips C can be beveled or straight cut.

As FIG. 20 illustrates, each LED chip C can comprise multiple lateral or exterior sides. LED chips C can be spaced apart from each other such that collectively, the LED chips C occupy approximately 25% to 50% of floor 154. Any size of LED chip C is contemplated, for example, large and/or small chips. In some aspects, chips are spaced at least a first distance $C_1$ away from the next closest LED chip. In some aspects, chips are spaced second distance $C_2$, a third distance $C_3$, and/or a fourth distance $C_4$ away from the next closest LED chips. Chip spacing $C_1$, $C_2$, $C_3$, and/or $C_4$ can, for example, be at least 50 μm or more, at least 100 μm or more, at least 200 μm or more, at least 300 μm or more, at least 400 μm or more, at least 500 μm or more, or at least 600 μm or more.

In some aspects, floor 154 can be similar in size and/or area to LES 116A (FIG. 16), and can comprise a diameter (e.g., D, FIG. 16) of approximately 6 mm to approximately 30 mm or more. A packing density of LED chips C within emission area and/or over floor 154 of emission area can, for example, be approximately 25% to 50% or more, and can be independent from chip size. In some aspects, settling or accumulating phosphor over floor 154 and/or about LED chips C can reduce bubbling defects. In some aspects, bubbles are reduced to less than two bubbles per LED chip C, less than one bubble per LED chip C, or zero bubbles per LED chip C. This reduction or elimination is because the time span/heating required for the settling process also allow bubbles to detach and float to the surface.

Figure 21:
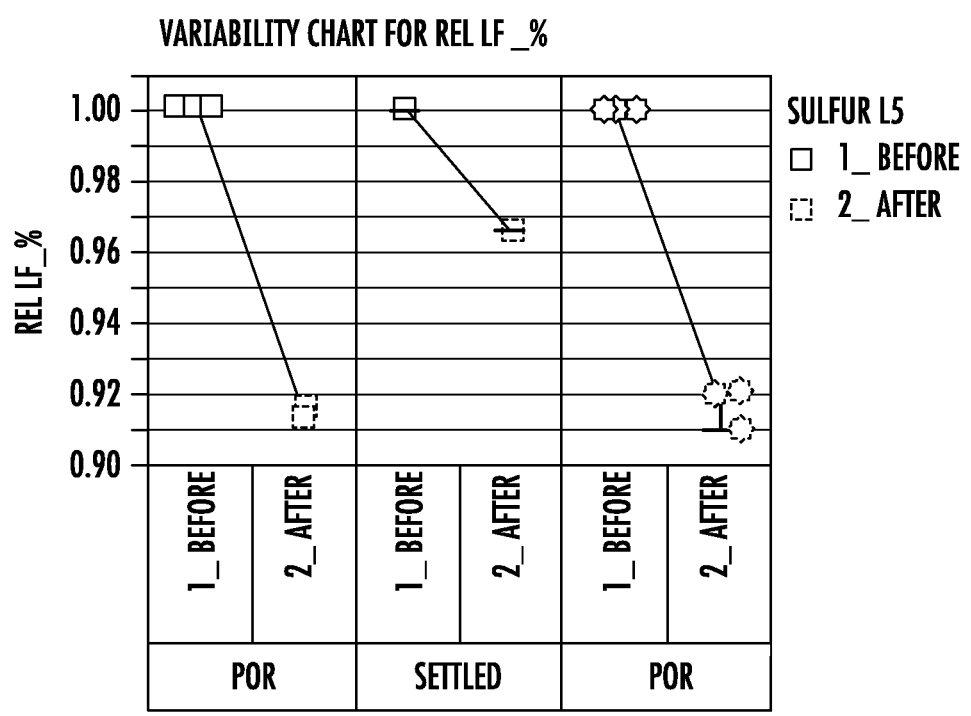
FIG. 21 graphically illustrates one benefit associated with light emitter devices and methods according to the disclosure herein.

FIG. 21 is a plot illustrating the improved sulfur resistance associated with LED devices and methods provide herein. FIG. 21 illustrates an amount of luminous flux (LF) lost between just before testing (e.g., at time=0), to a time just after conducting a sulfur test. As FIG. 21 illustrates, the devices having settled phosphor degrade less than the points of reference (POR) or non-settled parts upon exposure to a sulfur environment.

During operation, LED devices can be subjected sulfuric environments as described in U.S. Patent Application Publication Nos. 2013/0207142 and 2013/0207130 to Reiherzer and commonly owned herewith, the disclosures of which are hereby incorporated by reference herein in their entireties. Sulfur can penetrate the encapsulant or filling material, and degrade Ag coatings or layers within a device. Settling or accumulating phosphor over a floor and/or LED chips of the device can provide improved sulfur resistance by providing improved protection and/or covering of Ag components therein. Thus, the amount of loss light between time=0 (e.g., a time "before") until after completion of the test is limited to about 4% or less.

Embodiments as disclosed herein may provide one or more of the following beneficial technical effects: reduced cost of providing light emitter packages; reduced bubbling; high brightness; a high lumen density of approximately 30 lm/mm² or more; improved color rendering; lower color shift; improved sulfur resistance; smaller color point spread; improved reliability; improved long term reliability; improved thermal properties and/or thermal management; improved color mixing; and/or cooler phosphor, including all or any combination of such features.

While the light emitter devices and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter device comprising:
a substrate;
an emission area comprising an array of light emitting diode (LED) chips disposed over a planar surface of the substrate; and
a layer of material disposed over the array of LED chips, the layer comprising a non-uniform distribution of one or more wavelength conversion materials provided therein; and
the device having a lumen density of at least 30 lm/mm² or more.

2. The device of claim 1, wherein the device comprises a lumen density of at least 60 lm/mm² or more.

3. The device of claim 1, wherein the device comprises a lumen density of at least 90 lm/mm² or more.

4. The device of claim 1, wherein a packing density of the LED chips over a floor of the emission area is between approximately 25% and 50%.

5. The device of claim 1, wherein the emission area comprises a diameter of approximately 6 mm or more.

6. The device of claim 1, wherein the emission area comprises a diameter of approximately 9 mm or more.

7. The device of claim 1, wherein the emission area comprises a diameter of approximately 19 mm or more.

8. The device of claim 1, wherein the wavelength conversion material comprises phosphor for converting light emitted by at least one LED chip to a peak wavelength in a red color.

9. The device of claim 1, wherein the wavelength conversion material comprises phosphor for converting light emitted by at least one LED chip to a peak wavelength in a yellow color.

10. The device of claim 1, wherein the wavelength conversion material comprises phosphor for converting light emitted by at least one LED chip to a peak wavelength in a green color.

11. The device of claim 1, wherein a higher density of wavelength conversion material is provided proximate a bottom of the layer, and wherein a lower density of wavelength conversion material is provided proximate a top of the layer.

12. The device of claim 1, comprising two or more wavelength conversion materials provided in the layer.

13. The device of claim 1, wherein the layer comprises silicone encapsulant.

14. The device of claim 1, wherein a retention dam is provided about the emission area.

15. The device of claim 1, wherein the substrate comprises ceramic.

16. The device of claim 1, wherein the array of LED chips is arranged in multiple different patterns.

17. The device of claim 1, wherein each LED chip in the array of LED chips is configured to emit a same color of light.

18. The device of claim 1, wherein at least two LED chips in the array of LED chips are configured to emit different colors of light.

19. The device of claim 1, wherein each LED chip in the array of LED chips is spaced apart from a next closest LED chip by at least approximately 50 µm or more.

20. The device of claim 1, wherein each LED chip in the array of LED chips is spaced apart from a next closest LED chip by at least approximately 200 µm or more.

21. The device of claim 1, wherein each LED chip in the array of LED chips is spaced apart from a next closest LED chip by at least approximately 300 µm or more.

22. A light emitter device comprising:
a substrate;
an emission area comprising an array of light emitting diode (LED) chips disposed over the substrate; and
a layer of material disposed over the array of LED chips, the layer comprising a non-uniform distribution of wavelength conversion material provided therein; and
wherein the array of LED chips occupies approximately 25% or more of the light emission area.

23. The device of claim 22, wherein the device comprises a lumen density of at least 30 lm/mm² or more.

24. The device of claim 22, wherein the device comprises a lumen density of at least 60 lm/mm² or more.

25. The device of claim 22, wherein the device comprises a lumen density of at least 90 lm/mm² or more.

26. The device of claim 22, wherein the emission area comprises a diameter of approximately 6 mm or more.

27. The device of claim 22, wherein the emission area comprises a diameter of approximately 9 mm or more.

28. The device of claim 22, wherein the emission area comprises a diameter of approximately 19 mm or more.

29. The device of claim 22, wherein the wavelength conversion material comprises a phosphor for converting light emitted by at least one LED chip to a peak wavelength in a red color, a yellow color, a green color, a blue color, a white color, or combinations thereof.

30. The device of claim 22, wherein the amount of wavelength conversion material gradually increases towards a floor of the emission area.

31. The device of claim 22, wherein the layer comprises silicone encapsulant.

32. The device of claim 22, wherein a retention dam is provided about the emission area.

33. The device of claim 22, wherein the substrate comprises ceramic.

34. The device of claim 22, wherein chip spacing between two adjacent LED chips in the array of LED chips is approximately 50 µm or more.

35. The device of claim 22, wherein chip spacing between two adjacent LED chips in the array of LED chips is approximately 200 µm or more.

36. The device of claim 22, wherein chip spacing between two adjacent LED chips in the array of LED chips is approximately 300 µm or more.

* * * * *